United States Patent [19]

Vinciarelli et al.

[11] Patent Number: 5,443,534
[45] Date of Patent: Aug. 22, 1995

[54] PROVIDING ELECTRONIC COMPONENTS FOR CIRCUITY ASSEMBLY

[75] Inventors: Patrizio Vinciarelli, Boston; Hubert R. Zeller, III, Billerica, both of Mass.

[73] Assignee: VLT Corporation, San Antonio, Tex.

[21] Appl. No.: 947,937

[22] Filed: Sep. 21, 1992

Related U.S. Application Data

[63] Continuation-in-part of Ser. No. 916,480, Jul. 21, 1992, abandoned.

[51] Int. Cl.[6] .................................................... H01C 17/00
[52] U.S. Cl. .................................. 29/593; 29/610.1; 29/740; 29/835; 29/836
[58] Field of Search ................. 29/610.1, 612, 620, 29/593, 740, 832, 835, 836; 219/121.68, 121.69

[56] References Cited

U.S. PATENT DOCUMENTS

| | | | |
|---|---|---|---|
| 3,699,649 | 10/1972 | McWilliams | 29/620 X |
| 4,284,872 | 8/1981 | Graeme | 219/121.69 |
| 4,381,441 | 4/1983 | Desmarais et al. | |
| 4,563,564 | 4/1983 | Ericsen et al. | 29/610.1 X |
| 4,581,441 | 4/1983 | Desinarais et al. | 215/121.69 |
| 4,610,083 | 9/1986 | Campisi et al. | 29/832 |
| 4,626,822 | 12/1986 | Melkeraaen | 29/620 X |
| 4,825,536 | 5/1989 | Itemadani et al. | 29/836 X |
| 4,877,174 | 10/1989 | Bruhn | 29/835 X |
| 5,166,492 | 11/1992 | Rivera | 219/121.68 |
| 5,208,976 | 5/1993 | Bess et al. | 29/740 X |

Primary Examiner—Timothy V. Eley
Attorney, Agent, or Firm—Fish & Richardson

[57] ABSTRACT

Electronic components are provided for connection in electronic circuits being manufactured on a production line. A supply of component blanks is provided, and each of the electronic components is formed by removing material from one of the blanks. The electronic component is delivered for connection in a corresponding one of the electronic circuits. The steps of forming and delivering the electronic component are coordinated with the manufacture of the corresponding electronic circuit. Another aspect features high-volume, high-mix manufacture of electronic circuits on a production line, where the mix requires a number M of different component values within a range of values R, and N (smaller than M) different supplies of component blanks are provided, each supply suitable for making components having values within a subrange S of range R. In another aspect, operating parameters of a laser are determined automatically for use in trimming resistor blanks belonging to a common batch of blanks. In another aspect, each circuit includes an alterable component having a parameter value which can be altered and the alterable component is open-loop trimmed.

27 Claims, 23 Drawing Sheets

FIG.5a

MODEL NUMBER: VI-501
NOMINAL INPUT VOLTAGE: 300V
NOMINAL OUTPUT VOLTAGE: 5V

| PART | VALUE | WATTAGE |
|---|---|---|
| * | * | * |
| * | * | * |
| R1 | 40,000 OHMS(T) | 1/4 |
| R2 | TRIM 1 | 1/4 |
| Q1 | IRFBC30 | — |
| R3 | 1.38 MEGOHMS | — |
| R4 | TRIM 2 | 1/4 |
| C | 0.049µF | — |
| * | * | * |
| * | * | * |

CHARACTERISTICS:
$V_{DMAX} = 550V$
MEASUREMENTS:
$V_{REF1}$
$V_{REF2}$

MODEL NUMBER: VI-503
NOMINAL INPUT VOLTAGE: 300V
NOMINAL OUTPUT VOLTAGE: 15V

| PART | VALUE | WATTAGE |
|---|---|---|
| * | * | * |
| * | * | * |
| R1 | 120,000 OHMS(T) | 1/4 |
| R2 | TRIM 1 | 1/4 |
| Q1 | IRFBC30 | — |
| R3 | 1.38 MEGOHMS | — |
| R4 | TRIM 2 | 1/4 |
| C | 0.049µF | — |
| * | * | * |
| * | * | * |

CHARACTERISTICS:
$V_{DMAX} = 550V$
MEASUREMENTS:
$V_{REF1}$
$V_{REF2}$

MODEL NUMBER: VI-502
NOMINAL INPUT VOLTAGE: 300V
NOMINAL OUTPUT VOLTAGE: 12V

| PART | VALUE | WATTAGE |
|---|---|---|
| * | * | * |
| * | * | * |
| R1 | 96,000 OHMS(T) | 1/4 |
| R2 | TRIM 1 | 1/4 |
| Q1 | IRFBC30 | — |
| R3 | 1.38 MEGOHMS | — |
| R4 | TRIM 2 | 1/4 |
| C | 0.049µF | — |
| * | * | * |
| * | * | * |

CHARACTERISTICS:
$V_{DMAX} = 550V$
MEASUREMENTS:
$V_{REF1}$
$V_{REF2}$

MODEL NUMBER: VI-504
NOMINAL INPUT VOLTAGE: 300V
NOMINAL OUTPUT VOLTAGE: 24V

| PART | VALUE | WATTAGE |
|---|---|---|
| * | * | * |
| * | * | * |
| R1 | 192,000 OHMS(T) | 1/4 |
| R2 | TRIM 1 | 1/4 |
| Q1 | IRFBC30 | — |
| R3 | 1.38 MEGOHMS | — |
| R4 | TRIM 2 | 1/4 |
| C | 0.049µF | — |
| * | * | * |
| * | * | * |

CHARACTERISTICS:
$V_{DMAX} = 550V$
MEASUREMENTS:
$V_{REF1}$
$V_{REF2}$

FIG.5b

| MODEL NUMBER: VI-505 |
| NOMINAL INPUT VOLTAGE: 48V |
| NOMINAL OUTPUT VOLTAGE: 5V |

| PART | VALUE | WATTAGE |
|------|-------|---------|
| * | * | * |
| * | * | * |
| R1 | 40,000 OHMS | 1/4 |
| R2 | TRIM 1 | 1/4 |
| Q1 | IRF540 | — |
| R3 | 237,500 OHMS | — |
| R4 | TRIM 2 | 1/4 |
| C | 0.26μF | — |
| * | * | * |
| * | * | * |

CHARACTERISTICS:
$V_{DMAX} = 95V$
MEASUREMENTS:
$V_{REF1}$
$V_{REF2}$

| MODEL NUMBER: VI-507 |
| NOMINAL INPUT VOLTAGE: 48V |
| NOMINAL OUTPUT VOLTAGE: 15V |

| PART | VALUE | WATTAGE |
|------|-------|---------|
| * | * | * |
| * | * | * |
| R1 | 120,000 OHMS | 1/4 |
| R2 | TRIM 1 | 1/4 |
| Q1 | IRF540 | — |
| R3 | 237,500 OHMS | — |
| R4 | TRIM 2 | 1/4 |
| C | 0.26μF | — |
| * | * | * |
| * | * | * |

CHARACTERISTICS:
$V_{DMAX} = 95V$
MEASUREMENTS:
$V_{REF1}$
$V_{REF2}$

| MODEL NUMBER: VI-506 |
| NOMINAL INPUT VOLTAGE: 48V |
| NOMINAL OUTPUT VOLTAGE: 12V |

| PART | VALUE | WATTAGE |
|------|-------|---------|
| * | * | * |
| * | * | * |
| R1 | 96,000 OHMS | 1/4 |
| R2 | TRIM 1 | 1/4 |
| Q1 | IRF540 | — |
| R3 | 237,500 OHMS | — |
| R4 | TRIM 2 | 1/4 |
| C | 0.26μF | — |
| * | * | * |
| * | * | * |

CHARACTERISTICS:
$V_{DMAX} = 95V$
MEASUREMENTS:
$V_{REF1}$
$V_{REF2}$

| MODEL NUMBER: VI-508 |
| NOMINAL INPUT VOLTAGE: 48V |
| NOMINAL OUTPUT VOLTAGE: 24V |

| PART | VALUE | WATTAGE |
|------|-------|---------|
| * | * | * |
| * | * | * |
| R1 | 192,000 OHMS | 1/4 |
| R2 | TRIM 1 | 1/4 |
| Q1 | IRF540 | — |
| R3 | 237,500 OHMS | — |
| R4 | TRIM 2 | 1/4 |
| C | 0.26μF | — |
| * | * | * |
| * | * | * |

CHARACTERISTICS:
$V_{DMAX} = 95V$
MEASUREMENTS:
$V_{REF1}$
$V_{REF2}$

FIG.5c

| MODEL NUMBER: VI-509 |
| NOMINAL INPUT VOLTAGE: 28V |
| NOMINAL OUTPUT VOLTAGE: 5V |

| PART | VALUE | WATTAGE |
|---|---|---|
| * | * | * |
| * | * | * |
| R1 | 40,000 OHMS | 1/4 |
| R2 | TRIM 1 | 1/4 |
| Q1 | IRFZ44 | — |
| R3 | 140,000 OHMS | — |
| R4 | TRIM 2 | 1/4 |
| C | 0.416μF | — |
| * | * | * |
| * | * | * |

CHARACTERISTICS:
$V_{DMAX} = 56V$
MEASUREMENTS:
$V_{REF1}$
$V_{REF2}$

---

| MODEL NUMBER: VI-511 |
| NOMINAL INPUT VOLTAGE: 28V |
| NOMINAL OUTPUT VOLTAGE: 15V |

| PART | VALUE | WATTAGE |
|---|---|---|
| * | * | * |
| * | * | * |
| R1 | 120,000 OHMS | 1/4 |
| R2 | TRIM 1 | 1/4 |
| Q1 | IRFZ44 | — |
| R3 | 140,000 OHMS | — |
| R4 | TRIM 2 | 1/4 |
| C | 0.416μF | — |
| * | * | * |
| * | * | * |

CHARACTERISTICS:
$V_{DMAX} = 56V$
MEASUREMENTS:
$V_{REF1}$
$V_{REF2}$

---

| MODEL NUMBER: VI-510 |
| NOMINAL INPUT VOLTAGE: 28V |
| NOMINAL OUTPUT VOLTAGE: 12V |

| PART | VALUE | WATTAGE |
|---|---|---|
| * | * | * |
| * | * | * |
| R1 | 96,000 OHMS | 1/4 |
| R2 | TRIM 1 | 1/4 |
| Q1 | IRFZ44 | — |
| R3 | 140,000 OHMS | — |
| R4 | TRIM 2 | 1/4 |
| C | 0.416μF | — |
| * | * | * |
| * | * | * |

CHARACTERISTICS:
$V_{DMAX} = 56V$
MEASUREMENTS:
$V_{REF1}$
$V_{REF2}$

---

| MODEL NUMBER: VI-512 |
| NOMINAL INPUT VOLTAGE: 28V |
| NOMINAL OUTPUT VOLTAGE: 24V |

| PART | VALUE | WATTAGE |
|---|---|---|
| * | * | * |
| * | * | * |
| R1 | 192,000 OHMS | 1/4 |
| R2 | TRIM 1 | 1/4 |
| Q1 | IRFZ44 | — |
| R3 | 140,000 OHMS | — |
| R4 | TRIM 2 | 1/4 |
| C | 0.416μF | — |
| * | * | * |
| * | * | * |

CHARACTERISTICS:
$V_{DMAX} = 56V$
MEASUREMENTS:
$V_{REF1}$
$V_{REF2}$

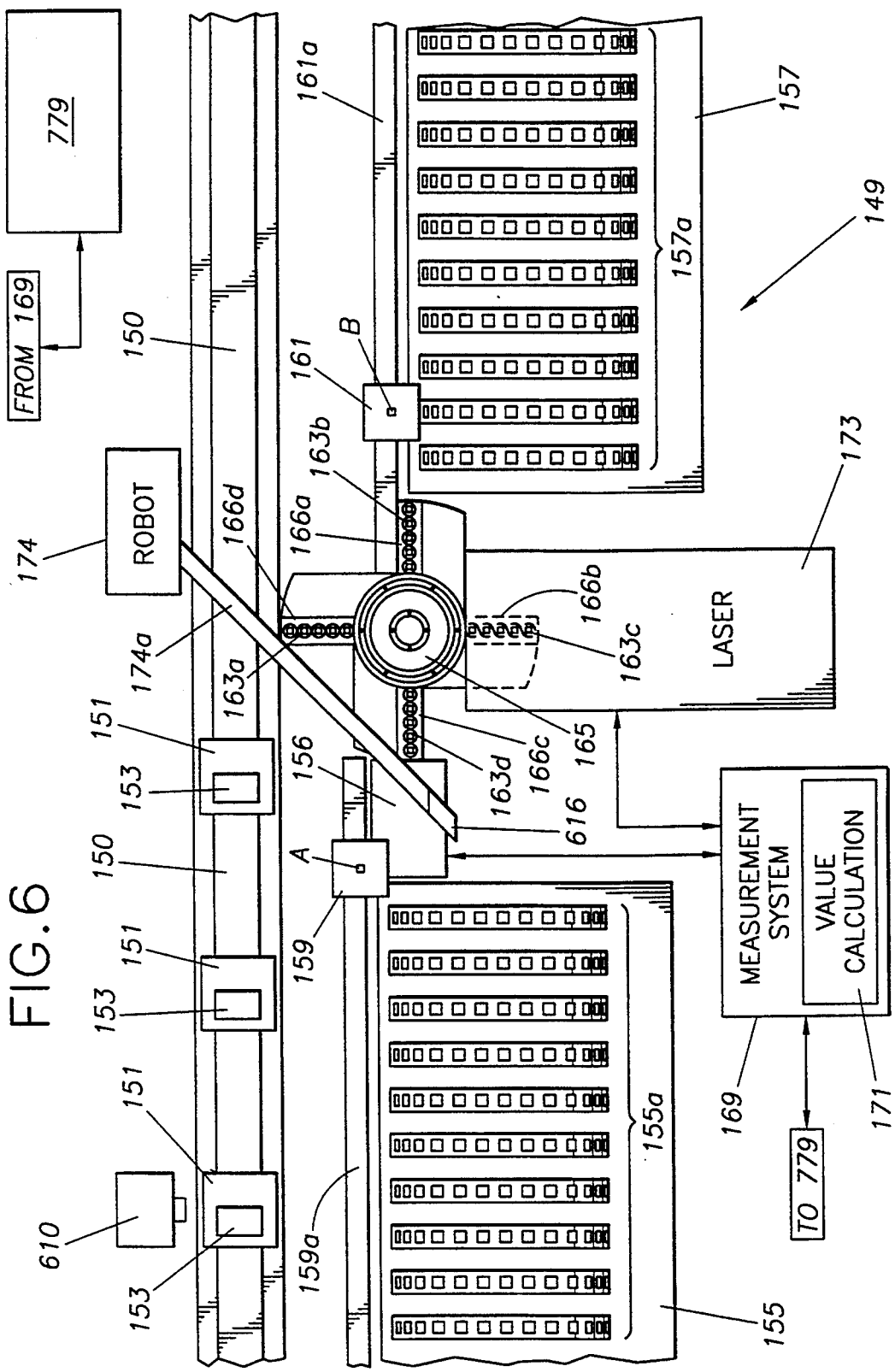

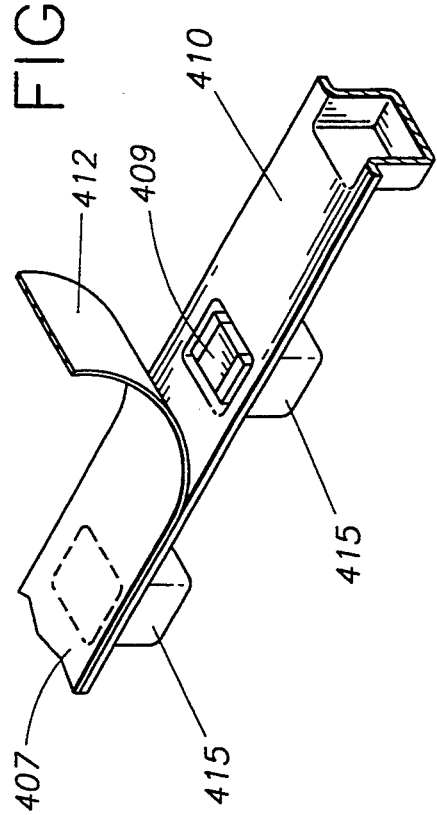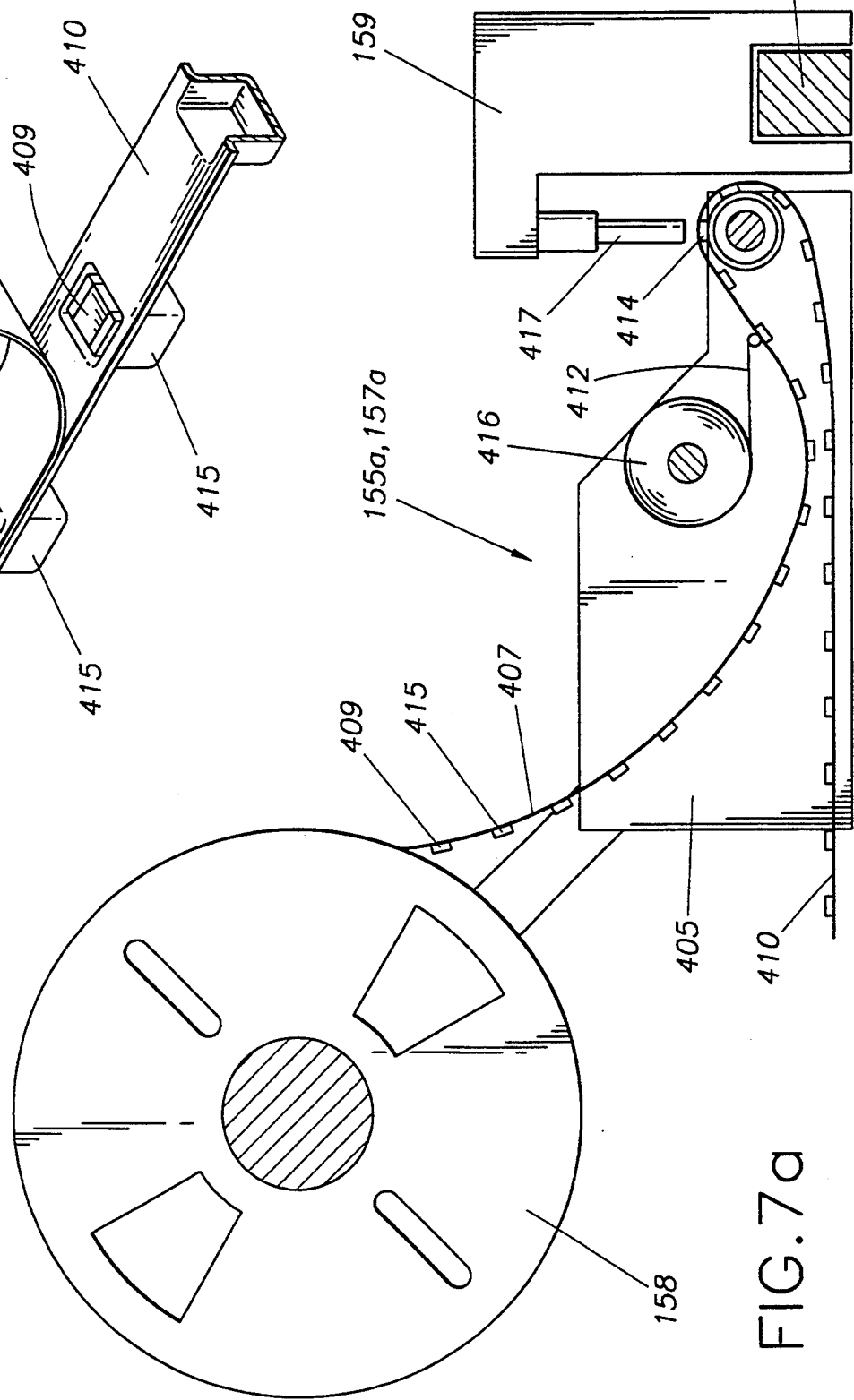

FIG.21

| NOMINAL VALUE | MINIMUM VALUE (≥) | MAXIMUM VALUE (<) | MINIMUM TOLERANCE |
|---|---|---|---|
| 6.8 | 8 | 12 | 10% |
| 10 | 12 | 16 | 10% |
| 14 | 16 | 23 | 10% |
| 20 | 23 | 33 | 5% |
| 28 | 33 | 46 | 5% |
| 39 | 46 | 62 | 5% |
| 53 | 62 | 88 | 5% |
| 75 | 88 | 129 | 5% |
| 110 | 129 | 188 | 5% |
| 160 | 188 | 267 | 5% |
| 230 | 267 | 387 | 5% |
| 330 | 387 | 551 | 1% |
| 470 | 551 | 798 | 1% |
| 680 | 798 | 1173 | 1% |
| 1k | 1173 | 1642 | 1% |
| 1.4k | 1642 | 2346 | 1% |
| 2k | 2346 | 3284 | 1% |
| 2.8k | 3284 | 4575 | 1% |
| 3.9k | 4575 | 6334 | 1% |
| 5.4k | 6334 | 8798 | 1% |
| 7.3k | 8798 | 12903 | 1% |
| 11k | 12903 | 18768 | 1% |
| 16k | 18768 | 26979 | 1% |
| 23k | 26979 | 38709 | 1% |
| 33k | 38709 | 56304 | 1% |
| 48k | 56304 | 79784 | 1% |
| 68k | 79784 | 117300 | 5% |
| 100k | 117300 | 164220 | 5% |
| 140k | 164220 | 234600 | 5% |
| 200k | 234600 | 328440 | 5% |
| 280k | 328440 | 457470 | 5% |
| 390k | 457470 | 633420 | 5% |
| 540k | 633420 | 879750 | 5% |
| 750k | 879750 | 1290300 | 10% |
| 1.1M | 1290300 | 1876800 | 10% |
| 1.6M | 1876800 | 2697900 | 10% |
| 2.3M | 2697900 | 3870900 | 10% |
| 3.3M | 3870900 | 5513100 | 10% |
| 4.7M | 5513100 | 7976400 | 15% |
| 6.8M | 7976400 | 12000000 | 15% |

PROVIDING ELECTRONIC COMPONENTS FOR CIRCUITY ASSEMBLY

BACKGROUND OF THE INVENTION

This invention is a continuation in part of application Ser. No. 07/916,480, "Altering Circuit Components" filed Jul. 21, 1992, now abandoned and assigned to the assignee of this application.

This invention relates to providing electronic components for circuits.

Electronic circuits to be made in large numbers are typically made on a production line. The line may be automated to increase the rate of production, reduce cost, and improve quality and uniformity. Resistors, capacitors, integrated circuits, and other electronic components are mounted on the circuits as they pass along the line. In one extreme mode of production, a large number of identical circuits are made using identical fixed-value components supplied at appropriate stations along the line. In an opposite extreme mode of production, a wide variety of circuits having different functional characteristics and different components are intermixed on the production line so that each circuit appearing on the line is potentially unique. This latter mode is sometimes called "lot-of-one" manufacturing. Thus, in general, the modes of high volume circuit production range from what is called high-volume, low-mix (relatively fewer variations among circuits) to high-volume, high-mix (relatively more variations).

The circuits on the line may differ in simple ways (for example in that one circuit requires a resistor of 100 ohms, while the next, otherwise identical circuit uses a resistor of 300 ohms); or in complicated ways, including completely different interconnections of components to serve completely different functions. In a high-mix mode, the number of different values of resistors and capacitors which must be available for connection into different circuits may be extremely large.

Resistors are often made by starting with resistor blanks (each blank is, e.g., a ceramic substrate bearing a pattern of resistive ink spanning conductive terminals). The blank is trimmed (e.g., by laser ablating the ink pattern) until a desired value of resistance is achieved. Sometimes it is the resistor manufacturer who trims the blanks and delivers them to the circuit maker as fixed value parts. In other cases, the circuit maker does the trimming after connecting the blank into a circuit. Laser trimming permits identical resistor blanks to be made in large numbers and later to be individually trimmed to desired resistances.

In one trimming technique, called closed-loop trimming, a resistor blank is trimmed while connected in an operating circuit. During trimming, a circuit parameter (e.g., the output voltage of a DC-DC power converter) is measured; trimming continues until the actual output voltage reaches a desired value.

An example of a circuit to which closed-loop trimming could be applied is the DC-DC converter 2 of FIG. 1. Increasing the level of a control input Vcont (provided by an error amplifier 1) increases the amount of current which the power train (power converter circuit) 5 delivers to the load and conversely, thus also controlling the voltage across the load (Vout).

The inputs of the error amplifier are Vref (a reference voltage) and Vdiv (the output of a voltage divider 3). The error amplifier is presumed to have a relatively high DC gain, but a finite value of offset voltage (indicated by voltage source Vos in series with the inverting input of the error amplifier). Assuming the DC loop gain of the circuit is relatively high, the output of the circuit is given by:

$$Vout = (1 + R1/R2)(Vref + Vos)$$

Vout is the controlled variable and R1, R2, Vref, and Vos are the controlling variables.

The circuit manufacturer generally does not control the values of Vref and Vos, but is able to control the value of Vout to meet the design specification by adjusting the values of R1 and/or R2. For simplicity, R2 may be a fixed resistor of predetermined resistance and tolerance and R1 a trimmable resistor blank. The resistance of the blank may be increased by ablating a cut line across a resistive element using a beam of laser light or a blast of sand. The initial value of R1 (i.e. the initial value of the resistor blank which is installed for R1) is selected such that, for worst case tolerance variations in R2, Vref, Vos, and the initial value of R1, the output voltage Vout is below its maximum desired value prior to trimming. This ensures that as the value of R1 is increased during trimming, the output voltage of the converter will increase toward the desired final value.

In the closed-loop trimming process, while the value of Vout of the operating circuit is measured, R1 is trimmed to bring Vout within the desired range. The effects of all controlling variables are automatically compensated by trimming R1.

A typical resistor blank includes the resistive film deposited on a ceramic substrate to provide a resistive path between two solder terminals wrapped around opposite ends of the substrate. A layer of glazed glass protects the film and stabilizes the resistor.

Vendors who use laser trimming to make fixed value resistors reset the operating parameters of the laser carefully prior to processing each batch of resistor blanks. The parameters are reset to compensate for differences between batches of resistor blanks which occur as a result of variations in the composition and/or thickness of the resistive ink; thickness or reflectivity of the protective glaze; or other reasons. In resetting the operating parameters for a new batch of blanks, a sample resistor is cut using a predetermined trim geometry and power setting of the laser. The quality of the cut (kerf) is then checked using a microscope with a backlight placed behind the substrate. The laser operating parameters are then adjusted if the cut is poor. When a high quality cut, and the desired final value of resistance, are achieved, a batch of resistors may be manufactured with a relatively high level of consistency.

SUMMARY OF THE INVENTION

The invention enables production of circuits in both high-volume, high-mix and high-volume, low-mix modes. Relatively few different kinds of raw components need to be supplied even for high-mix production. Successive batches of blank resistors can be used one after another in a laser trimming operation with automatic calibration of the laser trimmer to accommodate the different characteristics of the different batches. The invention reduces production costs and costs of inventory and is useful in highly automated production environments.

The invention also achieves rapid, accurate trimming of components using an open-loop trimming technique Trimming may be done without the need to measure parameters in an operating circuit and before the component being trimmed is connected into the circuit. No special modifications of the circuit design or slowing down of the manufacturing line are required. Lot-of-one circuits can be produced easily on an automated line. The circuit layout need not provide for access by the trimming device to the component to be trimmed.

Thus, in general, in one aspect, the invention features providing electronic components for connection in electronic circuits being manufactured on a production line, by the following steps. A supply of component blanks is provided, and each of the electronic components is formed by removing material from one of the blanks. The electronic component is delivered for connection in a corresponding one of the electronic circuits. The steps of forming and delivering the electronic component are coordinated with the manufacture of the corresponding electronic circuit.

Embodiments of the invention include the following features. There are N different supplies of blanks and greater than N different electronic components are formed from the blanks. The step of coordinating is controlled automatically and includes receiving information identifying an electronic circuit being manufactured on the production line; causing the formation of an electronic component suitable for the identified electronic circuit; and making available the formed electronic component for connection in the identified electronic circuit.

The blanks are resistor blanks which are laser trimmed. Each of N different supplies of resistor blanks is suitable for forming resistors having resistances within a particular range. In some embodiments, all of the resistors required for the electronic circuits are formed by laser trimming, including some which have values which do not differ among the electronic circuits. The step of coordinating comprises repeating the steps for successive electronic circuits, e.g., successive electronic circuits which require different electronic components.

In general, in another aspect, the invention features apparatus which includes the supply of component blanks, means for forming each of the electronic components by removing material from one of the blanks, means for delivering the electronic component for connection in a corresponding one of the electronic circuits, and means for coordinating (e.g., a programmable controller) the formation and delivery of the electronic component with the manufacture of the corresponding electronic circuit. In embodiments of the invention, a robot mounts the electronic component on the corresponding electronic circuit.

In general, in another aspect, the invention features high-volume, high-mix manufacture of electronic circuits on a production line, where the mix requires a number M of different component values within a range of values R. N (smaller than M) different supplies of component blanks are provided, each supply suitable for making components having values within a subrange S of range R. Each of the components is formed by the following steps. A component blank is selected from one of the supplies and trimmed to a predetermined value appropriate to one of the electronic circuits. Each of the trimmed components is delivered for connection in a corresponding one of the electronic circuits. The steps of forming and delivering the components are coordinated with the manufacture of the corresponding electronic circuits.

In general, in another aspect, the invention features a method (and corresponding apparatus) for determining operating parameters of a laser for use in trimming resistor blanks belonging to a common batch of blanks, each resistor blank including a substrate and a resistive material on the substrate. In the method the laser causes a series of ablations in a path on the resistive material of each one of a number of sample resistor blanks belonging to the batch. An operating parameter of the laser is changed to cause the number of ablations per unit length along the path to differ for different ones of the resistor blanks. The measured resistance values of the sample resistors after ablation are used to determine a level of the operating parameter at which the ablations form a kerf which severs completely any electrical connection between resistive material on either side of the kerf.

Embodiments of the invention include the following feature. The resistor blanks have two terminals at opposite ends of the substrate and resistive material lying on the substrate between the two terminals.

In general, in another aspect, the invention features a method of providing electronic components to be connected into electronic circuits being fabricated on a production line. A portion of each electronic circuit is measured to derive a parameter. An appropriate value for the electronic component to be connected into that electronic circuit is determined from the measured parameter. Material is removed from the electronic component to cause it to have the appropriate value.

Embodiments of the invention include the following features. The portion of each electronic circuit being measured is a single component disconnected from any other elements of the circuit. The material is removed by laser trimming. The electronic component is a resistor. After removal of the material, the actual value of the electrical component is measured, and an appropriate value for another electronic component is determined based on the actual value. Material is then removed from the other electronic component to cause it to have the appropriate value. The electronic circuits may be identical or non-identical circuits.

In general, in another aspect, the invention features a method of manufacturing the electronic circuits on a production line, each circuit including an alterable component having a parameter value which can be altered. A supply of the alterable components is provided. Then, for each electronic circuit on the production line, the following steps are performed. A measurement is made of a parameter of a disconnected device to be included in the circuit or of a parameter of a portion of the circuit. An appropriate parameter value for the alterable component is determined from the measured parameter. Material is removed from an alterable component, selected from the supply, to cause it to have a value corresponding to the appropriate value. The alterable component from which the material has been removed is then connected into the circuit.

In general, in another aspect, the invention features apparatus for providing electronic components to be connected into electronic circuits being fabricated on a production line. The apparatus includes an instrument for measuring a portion of each electronic circuit to derive a parameter, a computational unit for determining from the parameter an appropriate value for the electronic component to be connected into that electronic circuit, and a device for removing material from the electronic component to cause it to have the appropriate value.

In general, in another aspect, the invention features apparatus for automatically manufacturing electronic circuits on a production line, each circuit including an alterable component having a parameter value which can be altered. The apparatus includes the alterable component supply, the instrument, a computational unit for determining from the parameter an appropriate value for the alterable component to be connected into that electronic circuit, a material removing device, a machine for connecting the alterable component from which the material has been removed into the circuit, and a controller for coordinating the operation of the instrument, the computational unit, the material removing device, and the connecting machine with respect to each successive electronic circuit on the production line.

Other advantages and features will become apparent from the following description and from the claims.

DESCRIPTION

We first briefly describe the drawings.

FIGS. 5a through 5c are bills of material.

FIG. 6 is a plan view of a component mounting station.

FIG. 7a and 7b are, respectively, a side view, partially broken away, of a component feeder and an exploded perspective view of a tape used to feed components.

FIG. 21 is a chart of resistor values.

Figure 2:
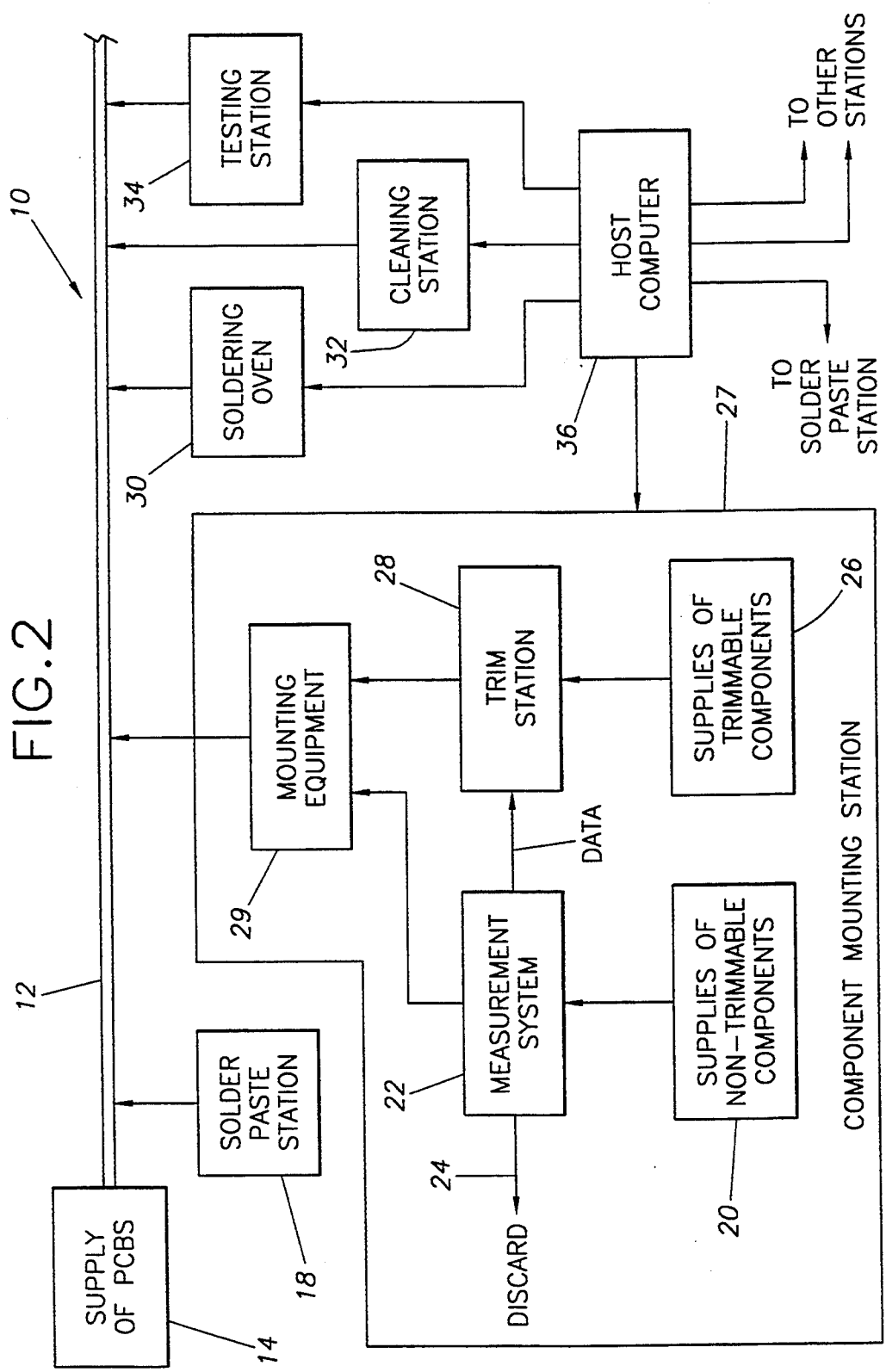
FIG. 2 is a block diagram of a production line.

Referring to FIG. 2, in an automated circuit production line 10, an inventory of empty printed circuit boards (PCBs) 14 is supplied at one end of a conveyor 12. The boards are conveyed along the line past a series of production stations. At a solder paste station 18, for example, solder is deposited at conductive pads and/or holes at locations on each board where conductive component terminations are to be soldered.

Components are mounted on each board at a component mounting station 27. The components may include both non-trimmable components (e.g., integrated circuit (IC) chips and passive components such as resistors and capacitors) and trimmable components such as trimmable resistors. Supplies of different kinds of non-trimmable components 20 and trimmable components 26 are located at the mounting station 27.

Electrical characteristics of the non-trimmable components may be measured (for reasons discussed below) and, if necessary, the measured characteristics may be stored by a measurement system 22. Defective components are discarded 24 and replaced from supply 20. For a given set of non-trimmable components, desired values of corresponding trimmable components may be determined at the measurement system, and these desired values may also be stored.

Trimmable components are delivered from supply 26 to a trim station 28 where they are laser trimmed either to prespecified values or to values determined from the values of other components whose values are measured by system 22. The trim station also includes a measurement capability which for purposes of FIG. 2 is considered to be part of the measurement system 22. Mounting equipment 29 receives the components after they are processed by measurement system 22 and trim station 28 and mounts them on the PCB.

After the non-trimmable and laser trimmed components have been mounted, the PCB is carried in sequence to a soldering oven 30 to reflow the solder paste, to a cleaning station 32 to remove flux and contaminates, and to a testing station 34 for final test. The board 14 also may be delivered to other stations (not shown) or packaged for shipment. Each station has programmable equipment (not shown in FIG. 2) for controlling the operation of the station. A host computer 36 is connected to each station to coordinate, e.g., the sequencing of operations, monitoring of inventory, selection of components, and storage of measurement data.

Figure 3:
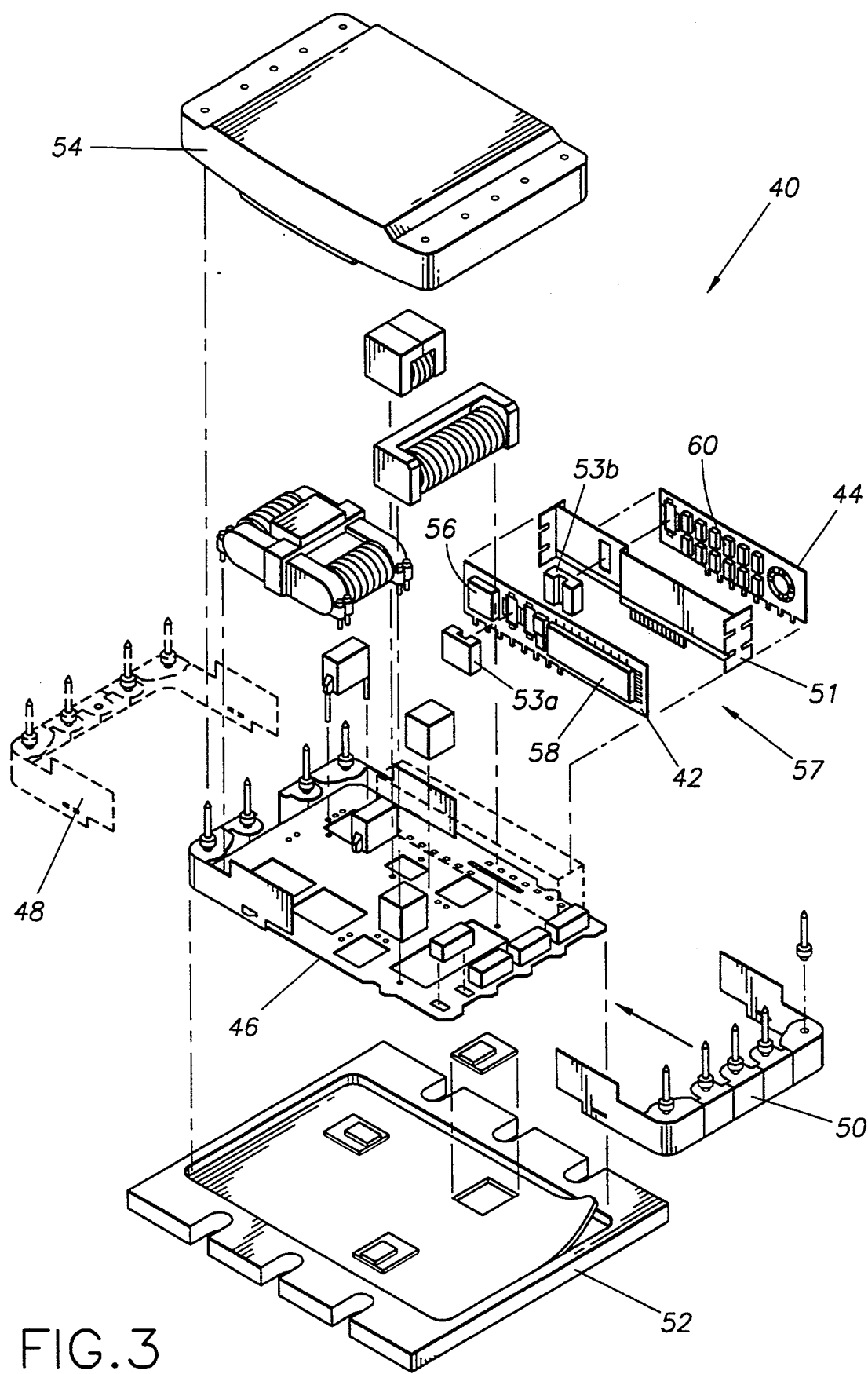
FIG. 3 is an exploded perspective view of a converter module.

Referring to FIG. 3, an example of a device that may be made on the production line is an electronic DC-DC converter module 40. Many of the electronic components of module 40 are mounted on a main PCB 46 along with two terminal fences 48, 50 for external connections. Main PCB 46 is supported on a baseplate 52 and enclosed by a cover 54. Also soldered to the main PCB is a control subassembly 57 which includes two circuit boards 42, 44 and a support 51. Electronic components (magnetic cores 53a, 53b, IC chips 56, 58, and a bank of resistors 60) are mounted on subassembly 57 before it is attached to the main PCB 46.

The design of the control subassembly 57, and the location of components within the subassembly, are both directed at maximizing performance of the finished converter. The control subassembly is designed to occupy a minimum volume within the overall package, to improve the power density of the finished module. Parts locations are chosen to minimize thermal resistance between heat generating components within the subassembly 57 and the baseplate 52 (e.g. heat dissipating IC packages 56, 58 are located on the outward facing surfaces of circuit boards 42, 44) to increase the maximum allowable operating temperature of the finished module.

Figure 1:
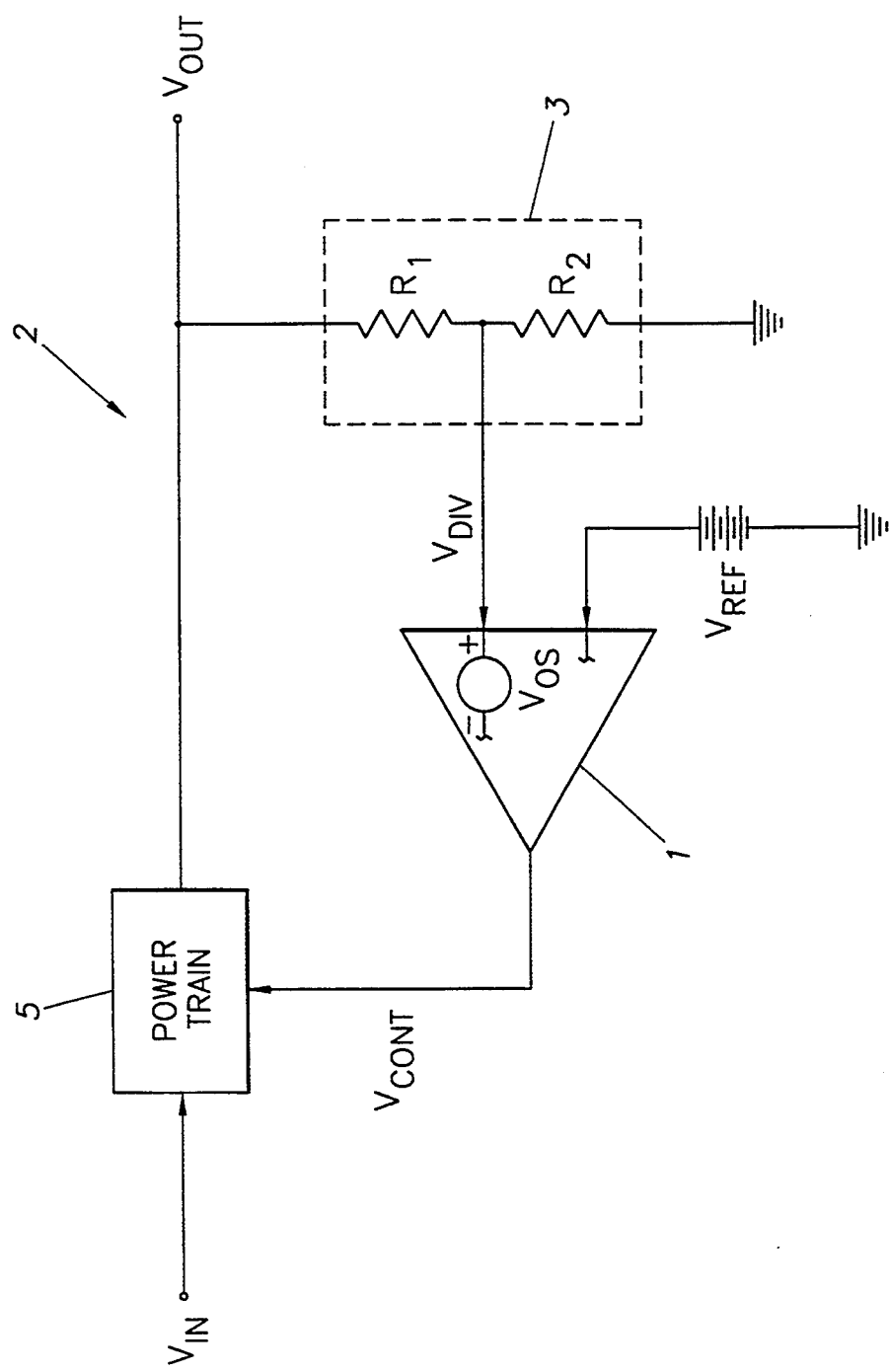
FIG. 1 is a schematic diagram of a portion of a DC-to-DC converter circuit.

The output voltage and other operating parameters of the assembled converter depend on actual parameter values of specific components used in the assembly (e.g., Vref1 in FIG. 1, produced by IC 58, and the values of one or more resistors 60, R1 and R2 of FIG. 1). But the output voltage of the converter module 40 cannot be closed loop set by laser trimming resistors 60 while the converter is being operated. This is because the resistors are not accessible to a laser beam after the control subassembly 57 has been attached to the main board 46.

In closed loop trimming, components to be trimmed must be physically accessible to the trimming device, a requirement that may be inconsistent with meeting certain performance criteria (e.g. small size, power density). In other cases, it may be difficult or impractical to set up conditions needed to perform closed loop trims. For example, in FIG. 4, a zero-current switching converter 10 includes an overvoltage protection circuit 80 (OVP), the operation of which is described in Appendix A. What is immediately important is that the OVP circuit protects against catastrophic failure of the converter by shutting the converter off if the value of the voltage, Vd, across the main switch 20 rises above a predetermined value Vdmax. The trip point of the circuit, and the circuit time constant, T, are, as explained in the Appendix, a function of the values of resistors R3 84 and R4 86 and capacitor C3 82. Even if they were physically accessible, closed loop trimming of R3 and R4 would be difficult because the value of Vdmax is based upon dynamic conditions which may be hard to set up in a closed loop system with any assurance of success. Trimming R3 and/or R4 while running the converter and monitoring the peak value of Vd until Vdmax is reached involves complex dynamic measurements and the danger of sudden catastrophic failure of the circuit. On the other hand, a static, closed loop method, i.e., applying a DC input voltage Vdmax across the input source terminals of the converter while trimming R3 and R4, would require that every component connected across the input source (e.g., input filter capacitor 16 in FIG. 4) be rated for Vdmax, rather than for the lower value of Vinmax (e.g., 600 V versus 400 V). This would make the circuit larger and more expensive.

In one aspect of the invention, the circuit parameters of the converter module are open loop trimmed, that is, the circuit parameters are set by calculating the desired values of resistors and trimming blanks to those values before the trimmed resistors are connected to the circuit. The desired values may be determined by measuring the operating parameters of other, nontrimmable components, such as an IC, also before the IC is connected in the circuit, or (in some cases) by measuring the values of other trimmable components after they have been trimmed.

Figure 4:
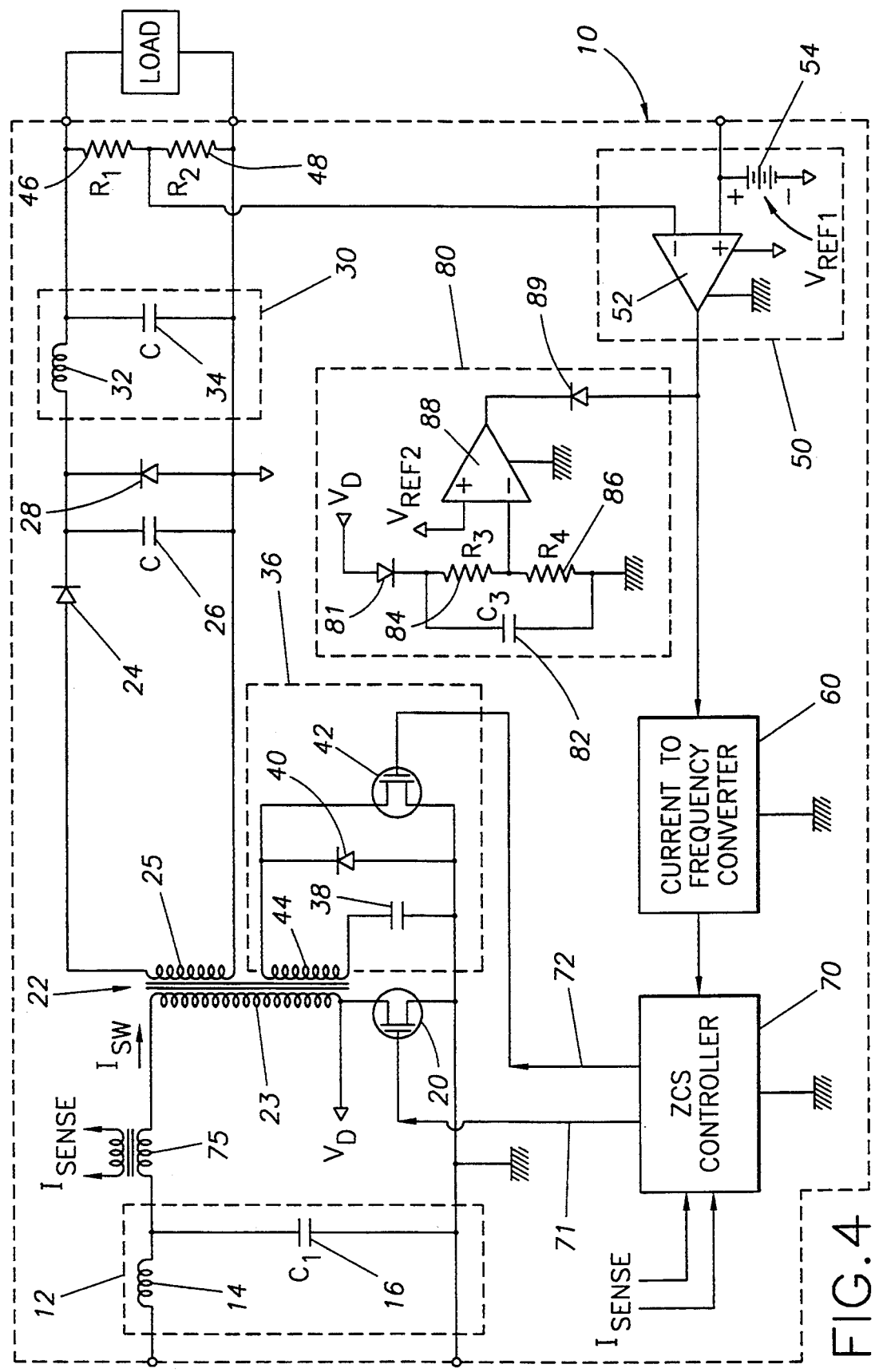
FIG. 4 is a schematic circuit diagram of a converter.

To help explain the open loop trimming method, we use the OVP circuit of the zero-current switching converter of FIG. 4 as an example. As described in Appendix A, resistors R3, R4 must be set to appropriate values as functions of Vdmax, and Vref2. The value of Vdmax is predetermined by the breakdown voltage rating of the main switch 20. As noted in Appendix A, a desired value for R3, R3des, may be determined based upon a prespecified value of the Thevenin's impedance, Rt, which is desired at the comparator input:

$$R3des = Rt*(Vdmax/Vref2).$$

A resistor blank, having an initial value below R3des, would be selected and trimmed to a nominal value R3des. The actual value after trimming, R3act, would be measured. The actual value of Vref2, Vref2act, would also be determined by measuring the source of the voltage (e.g. by measuring the actual integrated circuit which will be used in the particular circuit assembly to provide Vref2). Knowing the actual values R3act and Vref2act, allows calculating the required value for R4, R4act:

$$R4act = R3act*Vref2act/(Vdmax - Vref2act).$$

An appropriate resistor blank having a nominal initial value lower than R4act is selected and trimmed to the desired value before being connected into the circuit. In this example the value of R4 is calculated based upon actual measured values of circuit elements which are to be incorporated into the circuit assembly. One of the measured values, R3act, is the value of a resistor which had previously been determined by calculation and then formed by trimming. Using the actual value of a trimmed resistor in calculating the target trim value for another resistor improves the overall circuit accuracy. All of the resistors in the zero current switching converter of FIG. 4 (even those resistors whose values are fixed in the design and which could otherwise be bought in bulk, already trimmed to the correct values) may be made by laser trimming.

Note that divider resistors 46, 48 of FIG. 4 also may be open loop trimmed using, for example, the formulas discussed in describing the circuit of FIG. 1.

A family of DC-to-DC converter modules conforming to the general circuit of FIG. 4 may be produced in a high-mix mode on the production line of FIG. 2. Different models of converters within the family may differ, for example, in their operating specifications (e.g. nominal input voltage, output voltage, power level). Each model of converter module in the family has an associated bill of materials (BOM) which defines the components to be used in the converter and which also indicates circuit characteristics and measurements needed for open loop trimming of the particular model. For example, FIGS. 5a through 5c show portions of BOMs 702 for some members of a family of DC-DC converters. Each BOM 702 is identified by its model number 704 and includes a list of reference designators (e.g., R1, R2, R3, R4 of FIG. 4), circuit characteristics (e.g., Vdmax), and measurements (e.g., Vref1, Vref2) used for trimming. The module models in the example are organized in three groups having different nominal input voltages (300 V, 48 V, 28 V), with models in each group having different nominal output voltages (5 V, 12 V, 15 V, and 24 V). For each component, the BOM either gives a predefined value or measurements (e.g. Vref1, Vref2) are specified which are needed to determine the value. Each reference designator corresponds to a part which is to be mounted to a specific location on the PCB. In all cases a tolerance value (not shown in the Figures), which indicates the maximum acceptable deviation between the desired, nominal, value of the part and actual measured value of the part, would also be provided in the BOM for use in measuring the component.

For example, in the BOMs of FIGS. 5a through 5c the values for R1 and R3 have been prespecified to result in a nominal Thevenin equivalent impedance, Rt, of 20,000 ohms at the inputs of the error amplifier 50 and the OVP comparator 88 (see FIG. 4), presuming nominal values of 2.5 V and 8 V for Vref1 and Vref2 (the reference voltage inputs of the error amplifier 50, and OVP comparator 80, respectively). R1 and/or R3 may be either purchased as fixed-value components or made by on-line trimming of resistor blanks. Since, as explained below, a relatively small number (e.g. a number N, where N might be equal to forty) of blanks can produce an essentially limitless number (e.g. a number M) of trimmed resistance values, the latter approach allows for a significant reduction in on-line inventory requirements. In the cases of components which have prespecified values but which are to be made on-line by trimming (e.g. R1 or R3, for example), the BOM will also contain an indicator that the part is to be made by trimming (e.g. a "trim flag" would be indicated in the BOM). For example, in the BOMs of FIG. 5a the values for R1 are followed by the symbol "T" which is used to indicate that these predetermined values of resistance are to be achieved by trimming blanks.

In the BOMs of FIGS. 5a through 5d, the values of R1 and R2 relate directly to output voltage, but are independent of input voltage (e.g., all 5 V output converters have R1=40,000 ohms), while the values of R3 and R4 relate directly to input voltage, but are independent of output voltage (e.g., all 300 V converters have R3=1.38 Mohms). The value of R2 is determined by measuring the actual values of Vref1 (Vref1act) and R1 (R1act), and determining the value of R2 using the following relationship:

$$R2 = R1act * \frac{Vref1act}{Vout - Vref1act}$$

where Vout is the desired output voltage of the converter. R4 is similarly determined by measuring the actual values of Vref2 (Vref2act) and R3 (R3act), and determining the value of R4 using the following relationship:

$$R4 = R3act * \frac{Vref2act}{Vdmax - Vref2act}$$

where Vdmax is the peak value of the FET (e.g., main switch 20, FIG. 3, and noted as component Q1 in each BOM) drain voltage which has been predetermined to be considered safe in the application.

Each BOM is shown to include a "characteristics" section which lists predetermined values (e.g., Vdmax) needed to perform a calculation. Each BOM also includes a "measurements" section which lists fixed parameters to be measured for use in calculations (e.g. reference voltages Vref1 and Vref2). Inclusion of these sections in the BOM is meant to be illustrative: the information in these sections may actually reside elsewhere in the system database and may be accessed by the system by means of database linkages (e.g. they may be looked up in tables by using, for example, the model number). Where a component is to be trimmed, its value is represented in the BOM by a mnemonic (e.g. the values for R2 and R3 are shown as TRIM 1 and TRIM 2, respectively), which is used to point to a specific algorithm used in calculating the value. Thus, the mnemonic TRIM1 would point to a an algorithm stored in the system database which would be used to perform the calculation for R2 which is shown above.

Referring to FIG. 6, each PCB 153 carried along the conveyor 150 on a removable pallet 151 is associated with one of the BOMs by means of a fixed, preassigned, bar code label (not shown in the Figure) which is permanently affixed to each pallet. As PCBs are loaded onto pallets at the beginning of the assembly line, the model number of the final board assembly which is to be built is linked to the bar code number on the pallet (e.g. by host computer 36, FIG. 2) for the duration of the assembly process. Thus, as the pallet moves down the line the model number of the circuit assembly may be determined at each assembly station by reading the pallet bar code and querying the host computer for the model number which is linked to a particular pallet code. Once the assembly of the circuit is complete, the pallet is sent back to the beginning of the assembly line and its bar code is reused to identify another circuit assembly. The mix of successive PCBs may range from low-mix (e.g., a large number of one BOM followed by a large number of another BOM) or may be high-mix (e.g., one PCB of a first BOM, three PCBs of a second BOM, one PCB of a third BOM, two PCBs of the first BOM, and so on). As each PCB reaches the component mounting station 149 (which corresponds to station 27 of FIG. 2), appropriate components required by its BOM are selected, measured if necessary, trimmed if necessary, and mounted by robot 174 (part of the mounting equipment 29 of FIG. 2) on the PCB.

At the component mounting station, each of two feeder mechanisms 155, 157 has multiple component feeders 155a, 157a. Feeder mechanism 155 feeds different types of components A which are not to be trimmed (e.g., fixed resistors and capacitors). Feeder mechanism 157 feeds different kinds of components B to be trimmed (e.g., resistors). Two picker cars 161, 159 travel along respective rails 161a, 159a to pick up components from feeders and load them in nests 156, 163b for processing.

As shown in FIGS. 7a and 7b, each component feeder 155a, 157a includes a tape feeder 405 fed by a reel 158 holding a supply of identical components or component blanks 409. A tape 407, includes a pocketed strip 410, which provides a separate pocket 415 for each component or blank, and a flat strip 412 (FIG. 7b). The flat strip is connected by adhesive to the pocketed strip resulting in complete enclosure of each component or blank. Feeder 405 draws the tape from the reel; as each component or blank approaches a loading position 414 the flat strip 412 is peeled away and wound onto a take up reel 416. This exposes the component or blank within its pocket for pickup. The pocketed strip 410 with empty pockets is drawn away at the rear of the feeder 405. Picker car 159a has five suction tubes (one tube 417 is shown) which can be raised and lowered. When a tube is lowered onto the top surface of a component or blank, suction is applied to pick up the component or blank. Lowering the suction tube causes interruption of a light beam associated with a sensor on the feeder (not shown); sensing of this interruption is used to indicate that another component or blank is to be fed after the suction tube is raised.

Referring again to FIG. 6, components which are not to be trimmed are placed on a centering nest 156, while resistor blanks are placed on one of the nests 163 of an indexing dial 165.

Figure 8:
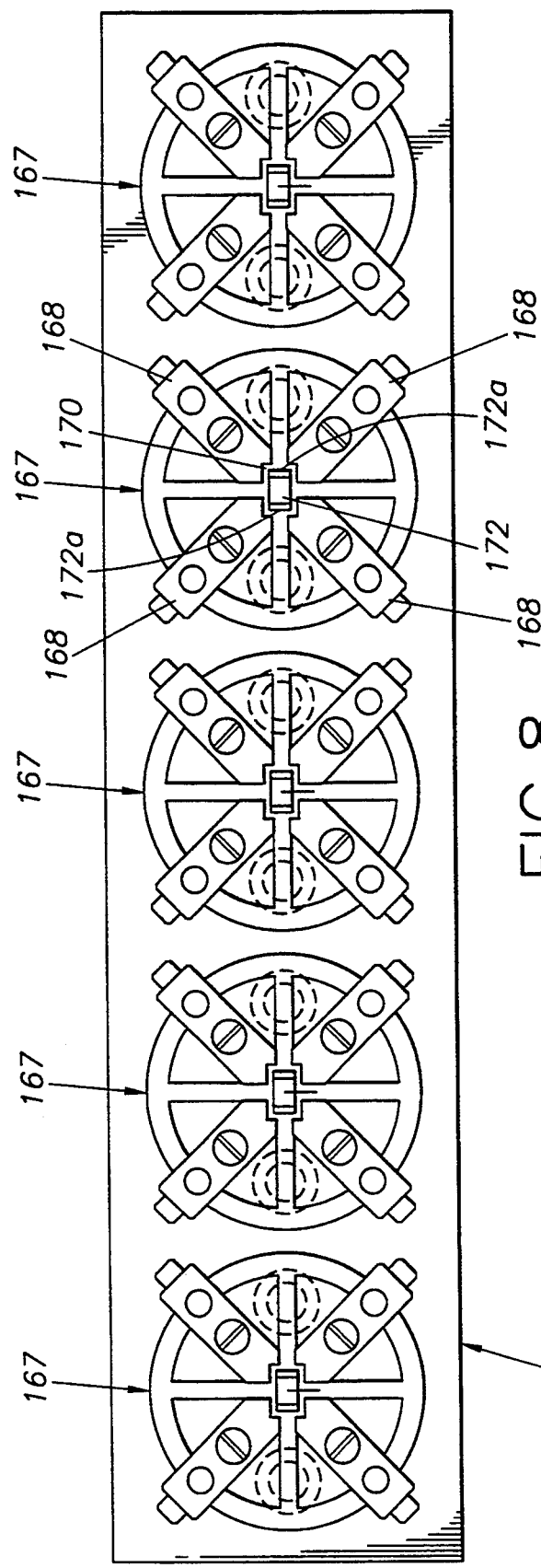
FIG. 8 is a top view of a component nest.
Figure 9A:
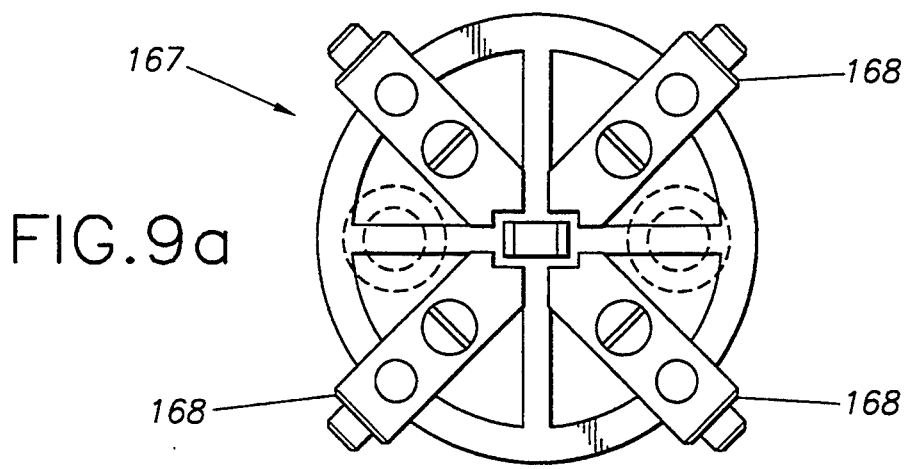
FIGS. 9a and 9b are top views of a collet in open and closed positions, respectively.
Figure 9B:
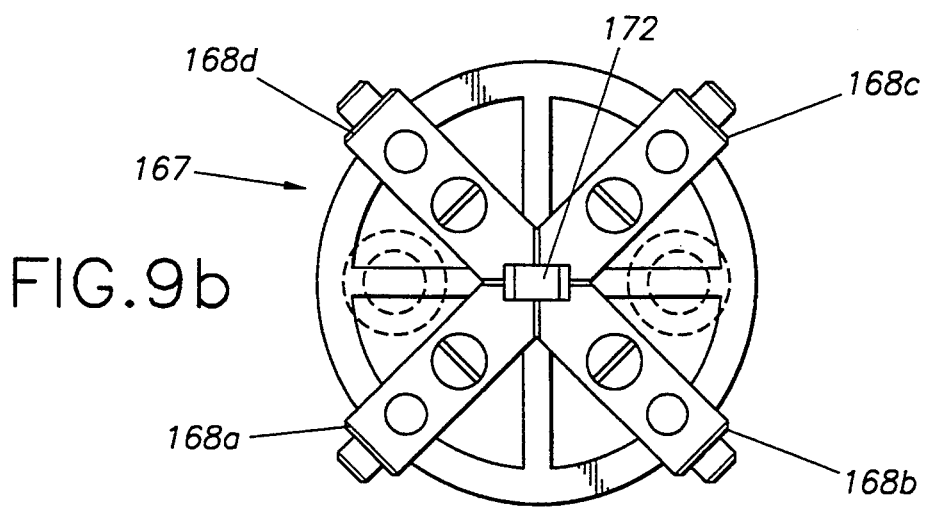

Indexing dial 165 has four nests 163a–d and can be rotated to cause the nests to be positioned at four fixed stations 166a–d. Picker car 161 loads resistor blanks into the nest located at the first station 166a. As shown in FIG. 8, each nest 163a–163d has five collets 167 to hold five surface-mount resistors. Each collet includes four positioning arms 168 which are biased inwardly to position, center, and hold a resistor blank 172 (or other component) in a rectangular area 170. After a resistor blank is placed in an open collet (FIG. 9a), the arms are closed (FIG. 9b) with two of the arms 168a, 168d electrically contacting one terminal 172a of the resistor blank (FIG. 8), and the other arms 168b, 168c contacting the other terminal of the resistor blank.

Figure 10:
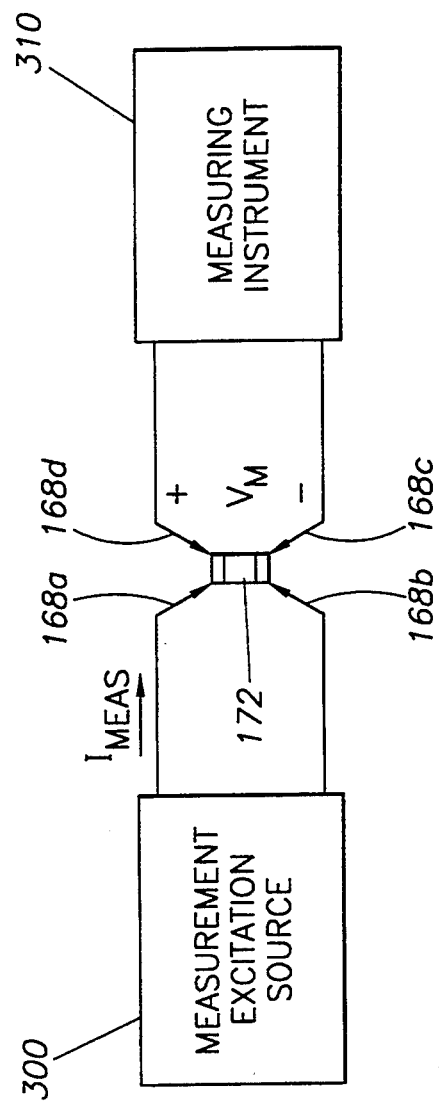
FIG. 10 is a schematic diagram of a measuring scheme.

Referring again to FIG. 6, at the second dial station 166b, the resistor values may be measured by a portion of measurement system 169 (corresponding to 22 of FIG. 2), which is electrically connected to the positioning arms of each of the collets 167. Referring to FIG. 10, measurement system 169 includes a measurement excitation source 300 and a measuring instrument 310. Using a Kelvin measuring scheme, the measurement excitation source 300 causes a measured current Imeas to flow through component 172 via arms 168a, 168b of the collet 167, and the resulting voltage Vm across the component is measured by the measuring instrument 310 via arms 168c, 168d of the collet. The component value may then be determined by appropriate calculation using Vm and Imeas.

Figure 11:
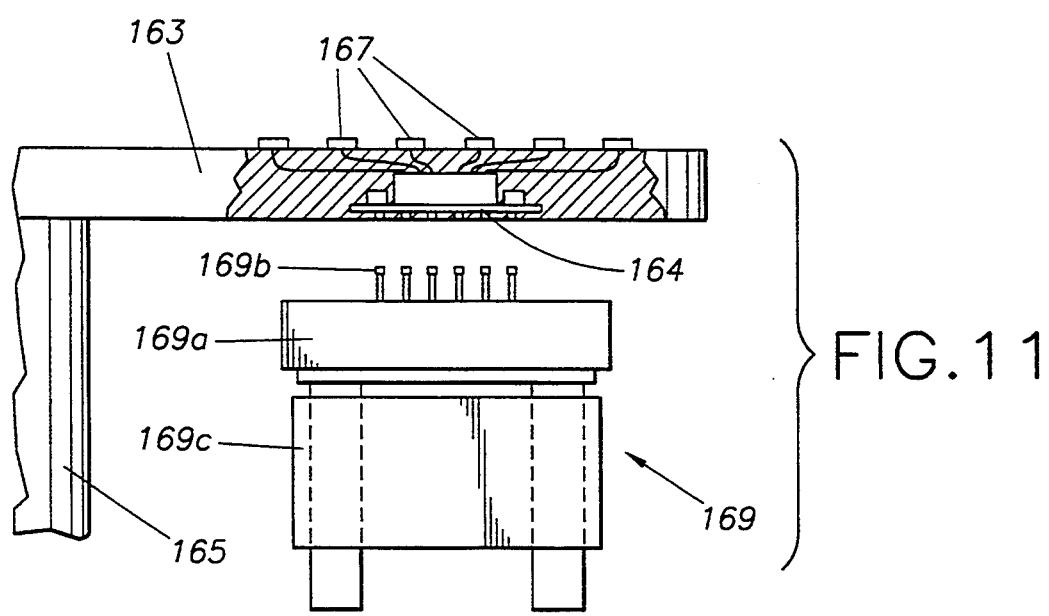
FIG. 11 is a side view of a collet and electrical test pins.

As shown in FIG. 11, the measurement apparatus 169 connects to the collets in the nests of the indexing dial 165 via a sliding head 169a having pogo pins 169b. The sliding head is held on a support 169c. For measurement the sliding head moves up and the pogo pins contact terminals on a small PCB 164 mounted below the indexing dial at the second station 166b. After measurement, the sliding head moves down to allow rotation of the indexing dial.

Measurement system 169 also measures the values of non-trimmable components A held in the centering nest 156 in a similar way except that the electrical connections need not be achieved via a sliding head because the centering nest 156 does not move. Referring again to FIG. 6, a high-voltage nest 779 is also connected to measurement system 169 to permit high voltage testing of components as discussed below.

Figure 12:
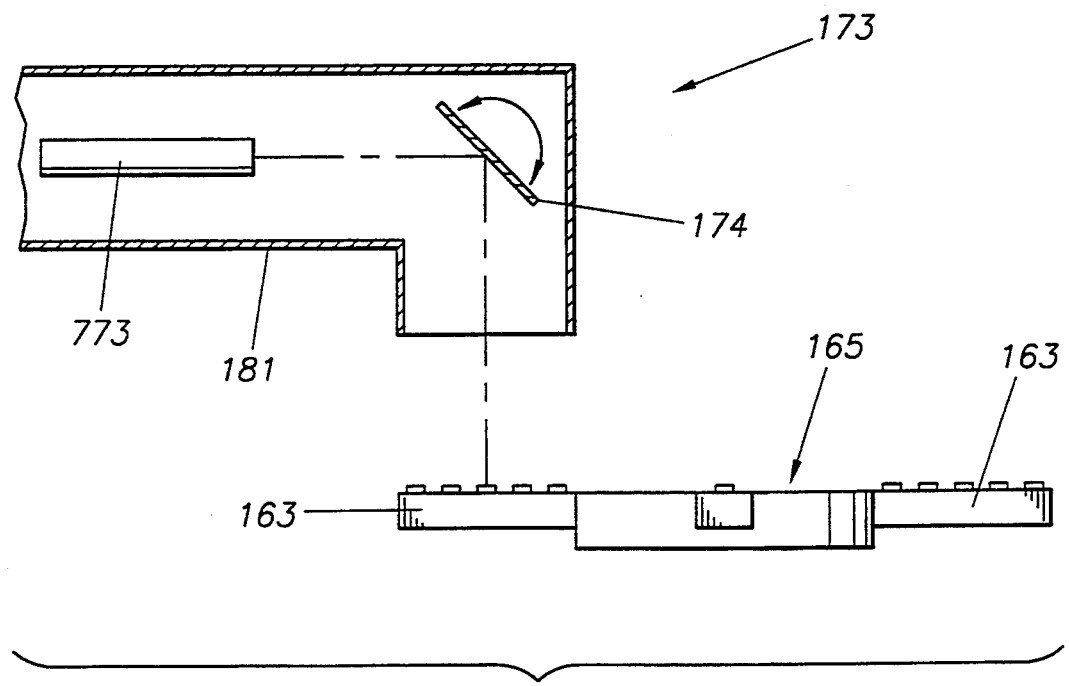
FIG. 12 is a schematic side view of a laser structure and net dial.

After a relevant non-trimmable component is measured, corresponding desired resistor values are calculated by a value calculation circuit 171 (FIG. 6) which is part of the measurement system, and the resistors are trimmed to the calculated values by laser trimmer 173 (e.g., Model 4000A YAG laser, Electro-Scientific Industries, Portland, Oreg., USA). As shown in FIG. 12, laser trimmer 173 includes an enclosure 181 which supports a laser 173 and a system of mirrors and optics (which, for simplicity, are shown in the Figure as a movable reflector 174) which directs the beam in succession to each of the resistor blanks held in one of the nests 163 mounted on the index dial 165. Support enclosure 181 is held above the second station 166b. The resistor blanks being trimmed are measured during trimming to ensure that the desired values are reached.

Referring again to FIG. 6, an extendible arm 174a of a robot 174 loads the PCB with trimmed resistors and other components picked up, respectively, from the nest at either station 166c or station 166d (the other is idle) and from the centering nest 156.

Figure 13A:
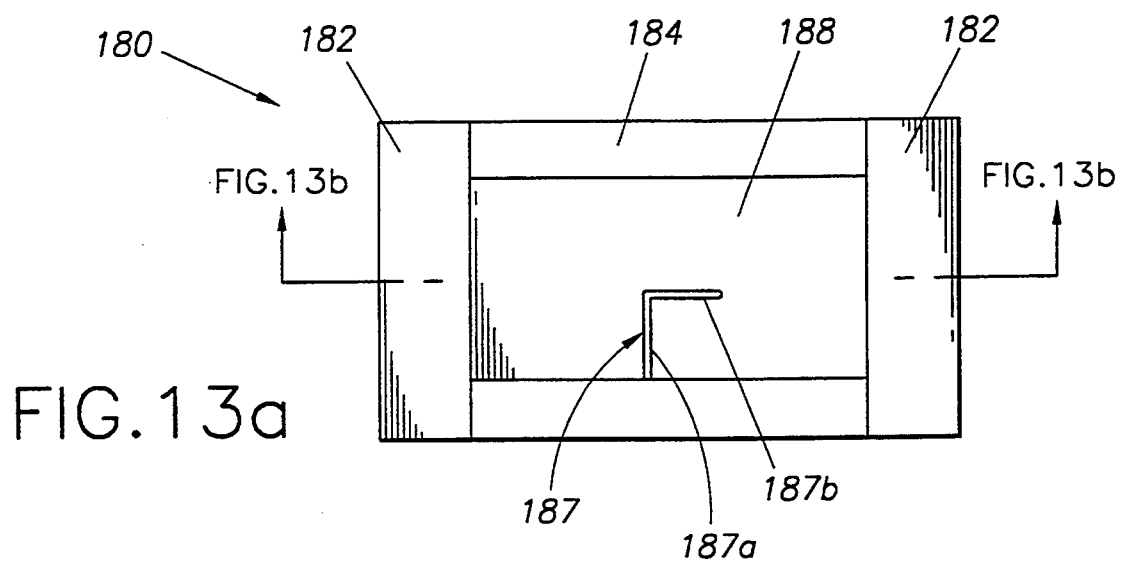
FIGS. 13a through 13c are top, side, and expanded side views, respectively of a resistor blank.
Figure 13B:
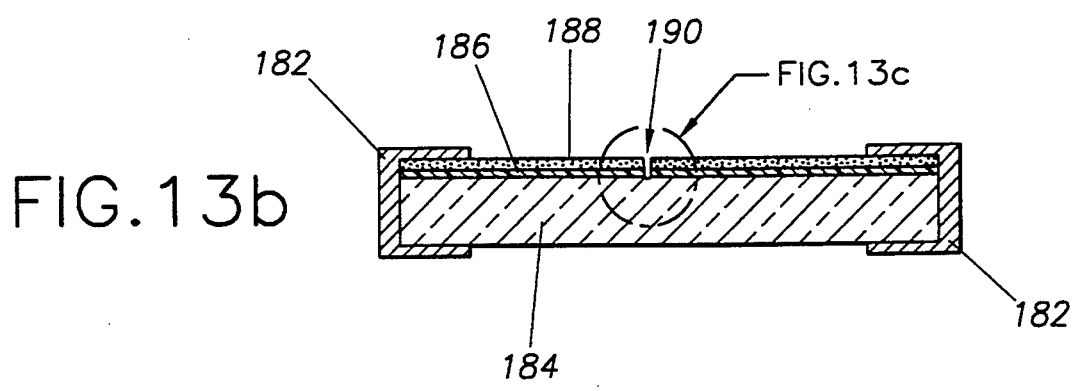
Figure 13C:
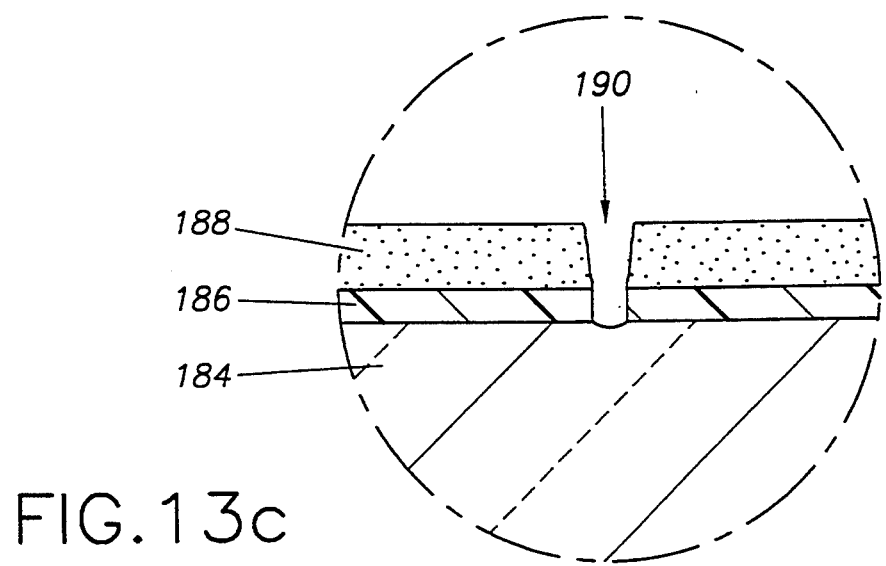

Before explaining the details of the laser trimming process and calibration of the laser, we will briefly describe the structure of a resistor blank. As shown in FIGS. 13a through 13c, in a resistor blank 180, a thick film of resistive ink 186 is sandwiched between a ceramic substrate 184 and a protective layer of glazed glass 188. Two conductive electrodes 182 attached to opposite ends of substrate 184 provide connections to the resistive element. The laser ablates material from the resistive film 186 along a cut line 187 to change the current and voltage distributions which occur across the film. As the laser beam is scanned across the surface of the resistor blank 180, a kerf 190 is cut through the protective glass layer 188 and resistive film 186 to the substrate. The cut has two segments. One segment 187a is generally perpendicular to the edge of the blank and represents a rough cutting to a value near to the desired value. The second segment 187b is generally parallel to the edge of the blank and represents a fine adjustment to reach the desired value. As explained below, the cut is actually formed by a series of laser pulses. After each laser pulse a resistance measurement is made. The laser is controlled based on the error between the measured resistance of the blank (which is measured by the measurement instrument which is part of the laser trimmer) and the desired resistance. Other shapes and patterns of cut lines may also be used.

The kerf of the laser cut must be carefully controlled to assure the stability and long life of the trimmed resistor. Because different reels or batches of resistor blanks have different laser cutting characteristics, the operating parameters of the laser (e.g., pulse power and writing speed) must be calibrated for each reel. In one aspect of the invention, calibration is simple, rapid, and automatic. This assures that the calibration process will not degrade high-volume, high-mix operation of the line and permits reels to be bought from different blank makers and used at different times. Calibration information for a given reel is stored in the system database for subsequent use with the reel.

Figure 14:
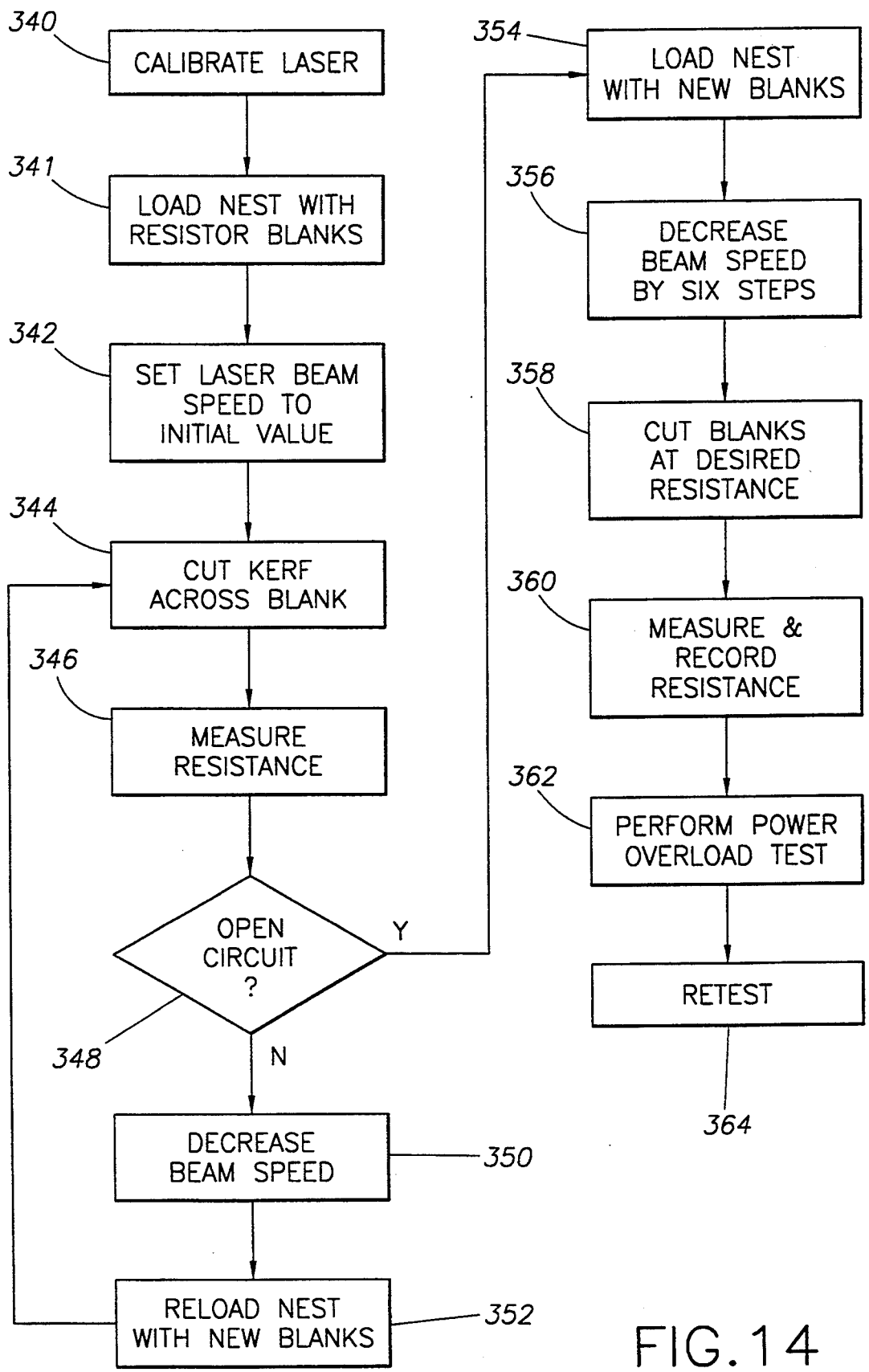
FIG. 14 is a flow chart for calibrating laser parameters for a new reel of parts.

Referring to FIG. 14, automatic calibration is begun by an operator when a reel of components is first mounted on the feeder mechanism 157 (FIG. 6).

First, the laser itself is calibrated 340 to correct natural drift caused by aging. The beam is aimed into the power head of a high accuracy power meter and the laser is fired at a nominal current in continuous wave mode. A change in the measured power from the previous value is compensated by adjusting the laser parameters so that the measured power remains constant. Calibration 340 is done periodically even if a reel is not replaced.

Figure 15:
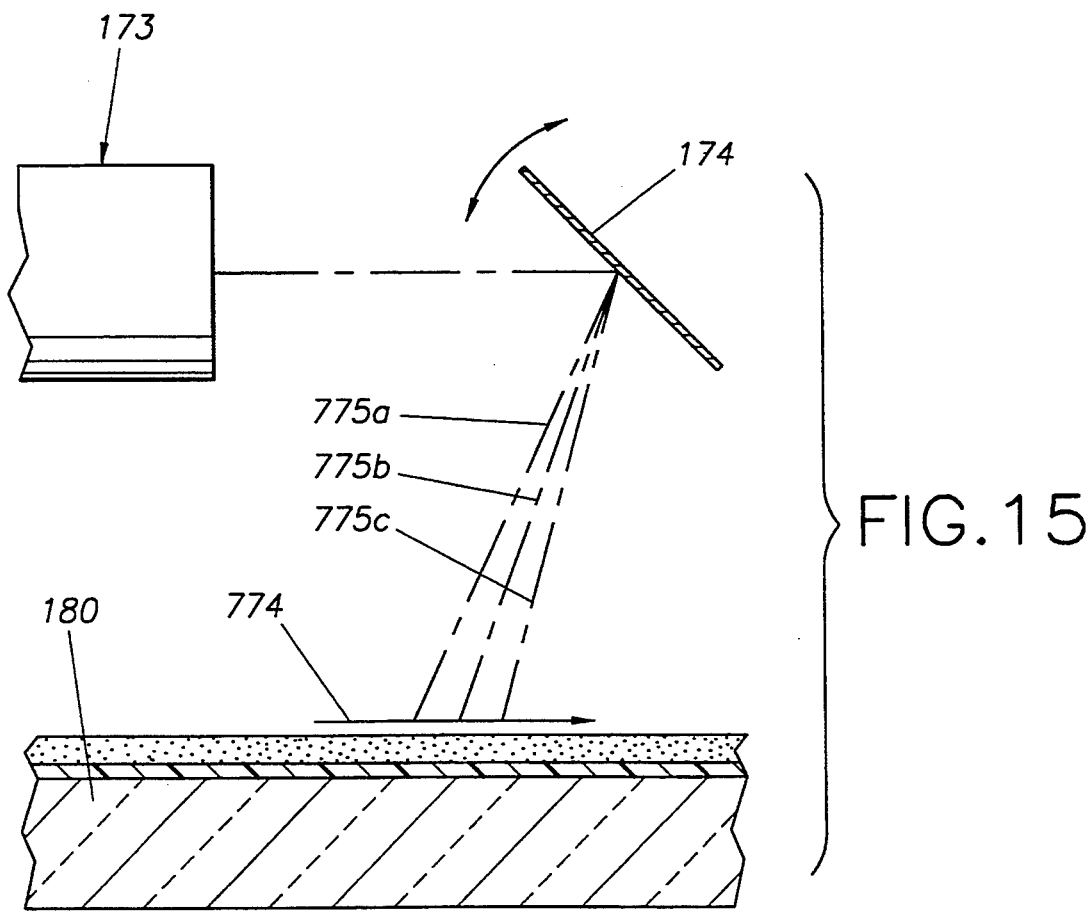
FIG. 15 is a schematic side view of a resistor blank being scanned.
Figure 16A:
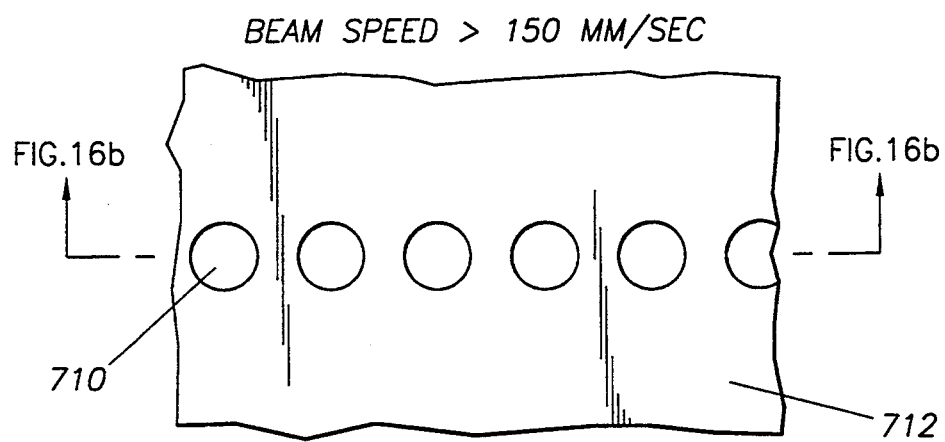
FIG. 16a through 16c are top, side sectional, and top views of laser cut resistor blanks.
Figure 16B:
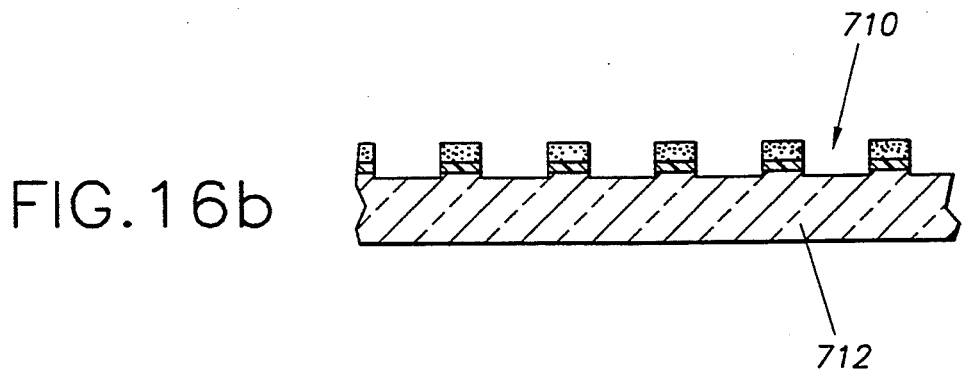
Figure 16C:
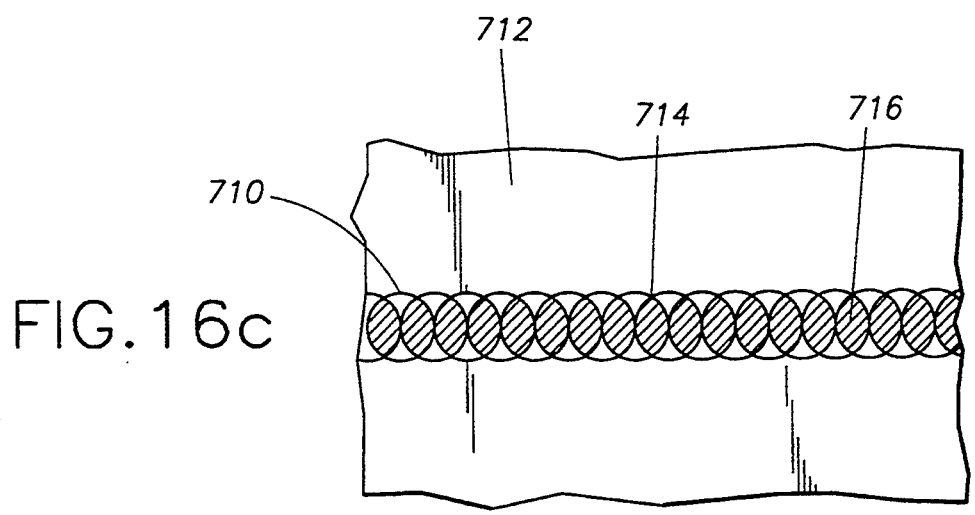

Next, a nest 163 (FIG. 6) is loaded (341) with sample blanks from the new reel. The laser beam speed is set at an initial, predetermined, value (342). A cut is made completely across the width of each blank (344). As shown in FIG. 15, the beam is scanned along the surface of the blank by means of the laser's system of mirrors and optics (again shown, for clarity, as reflector 174) along a path 774. While being scanned, the laser forms the cut by a series of laser flashes (pulses) 775. In FIG. 15 the effect of scanning and pulsing is shown to result in a sequence of beams 775a, 775b, 775c each of which impinges upon the surface of the blank along the path 774. As the beam is scanned each flash impinging upon the surface of the blank ablates the resistive ink in an area defined by a disk 710 (FIG. 16a). The ultimate objective is to scan the laser quickly enough so that successive pulses form a continuous cut line 714 (FIG. 16c) having an adequately broad kerf. The following table gives an example of how scanning speed relates to the number of pulses per a given length of cut (e.g. the Pulse Density)(only a portion of the table is shown):

| Speed (mm/sec) | Pulse Density |
| --- | --- |
| 150 | 1 |

-continued

| Speed (mm/sec) | Pulse Density |
| --- | --- |
| 75 | 2 |
| 50 | 3 |
| 37.5 | 4 |
| 30 | 5 |
| 25 | 6 |
| 21.4 | 7 |
| 18.8 | 8 |
| 16.7 | 9 |
| 15 | 10 |
| . | . |
| 10 | 15 |
| . | . |

In the table, the first ten listed speed increments each result in the Pulse Density increasing by one; an additional higher speed is also shown to indicate that virtually any Pulse Density can be achieved by simply reducing the speed at which the beam traverses the surface of the blank.

Referring again to FIG. 14, after an initial scan is made across the resistor blanks, the resistances of the blanks are measured (346) by the measurement instrument which is part of the laser trimmer. If a cut has penetrated the resistive films all across the blanks, the resulting open circuits are detected (348) as essentially infinite resistances. (On the first pass through the procedure, the laser would have been set to preclude a complete cut). If open circuits are not found, the beam speed is reduced (350) to increase the Pulse Density by one. A new set of blanks are scanned (344) at the new speed. The steps are repeated until an open circuit is detected.

For final adjustment, a new set of blanks are loaded (354), the beam speed is reduced (356) so as to increment the Pulse Density by six counts (e.g., with reference to the table above, if the beam speed at which an open circuit was first detected were 37.5 mm/sec (Pulse Density=4), then the reduced beam speed would be set to 15 mm/sec (Pulse Density=4+6=10). This strategy has been empirically determined to result in a desirable kerf width of approximately 2.9 mils. The blanks are then trimmed by cuts (like the one in FIG. 13a), at the reduced beam speed setting, to reach a resistance value (358) which is the highest resistance value within the range of resistances which can be effectively made from that reel of blanks (e.g. see FIG. 21) (for typical ¼ Watt commercial surface-mount resistor blanks it has been empirically determined that the highest repeatably trimmable resistance value for a blank is approximately twice the nominal value of the blank). The resistances of the trimmed blanks are measured, and the measurements recorded (360). Next the blanks are moved by the robot onto the high voltage nest and subjected to an electrical power level approximately 2.5 times rated power (e.g., 625 milliwatts for a ¼ watt resistor) for 5 seconds (362). The blanks are then returned to the laser trimmer and retested (364) for drift. If drift is more than 0.2% of the previously measured resistance, the calibration operation is deemed to have failed. The operator is alerted so that the calibration may be repeated with a new set of blanks; the adequacy of the kerf of the newly cut blanks is then inspected visually.

Figure 17:
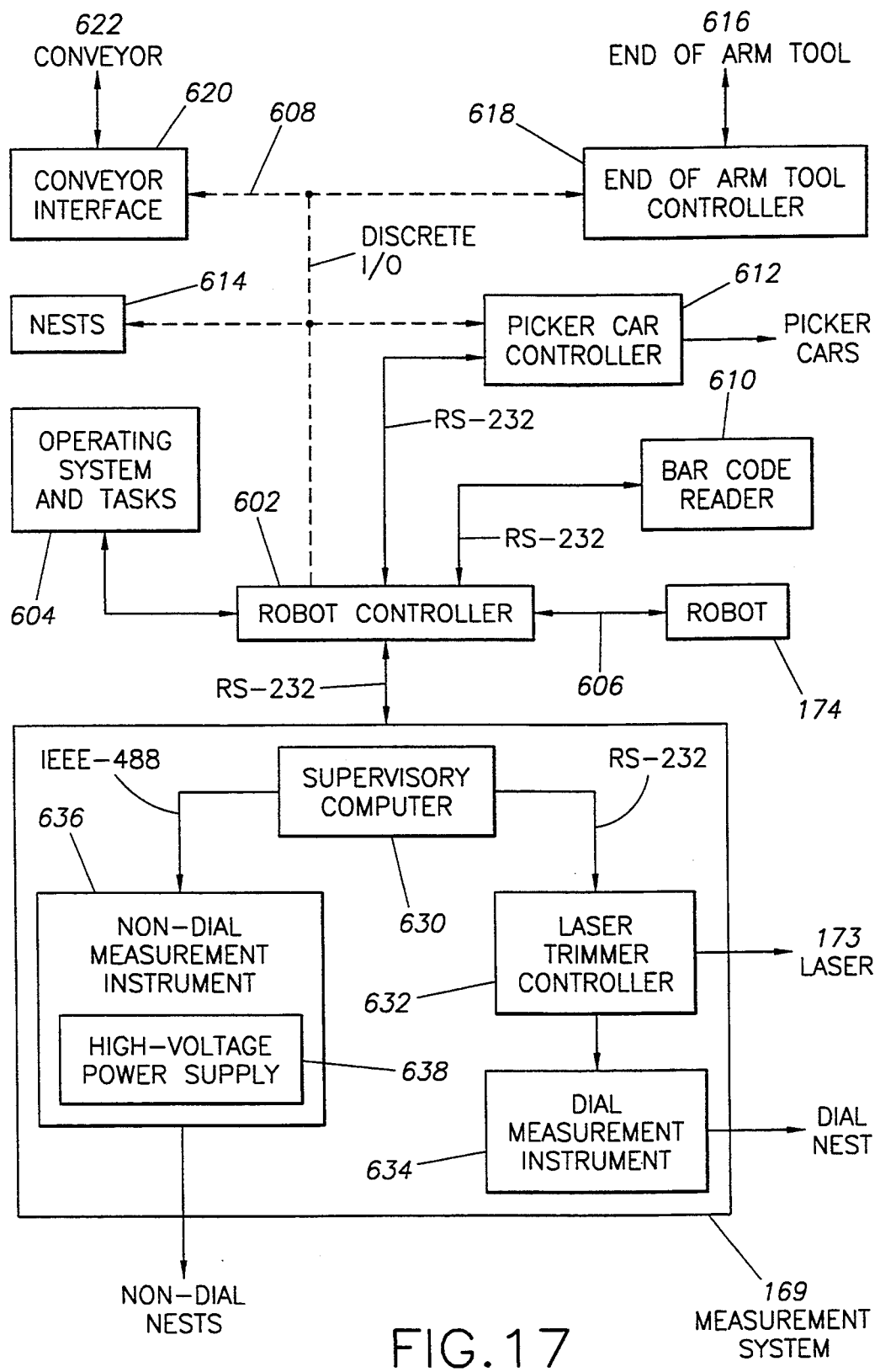
FIG. 17 is a block diagram of a control architecture.

Referring to FIG. 17, a robot controller 602 (e.g., an Adept A series controller, Adept Technology Inc., San Jose, Calif.) provides overall supervision of the component mounting station. Controller 602 includes a microprocessor and communication ports and runs an operating system and control tasks 604 discussed below. Controller 604 is connected directly by a cable 606 to robot 174 and by RS232 and discrete I/O links 608 to other equipment in the mounting station. Controller 602 coordinates the operation of the equipment in the mounting station so that for each board appearing on the production line, the proper components are selected, tested, measured, trimmed, and mounted on the board.

A PLC (Programmable Logic Controller) conveyor interface 620 (Allen-Bradley PLC Model 510) receives signals from sensors on the conveyor and sends control signals to actuators on the conveyor to cause and stop motion of each pallet at appropriate times. The conveyor interface controller signals the robot controller when a pallet has arrived at the mounting station, and the robot controller signals the conveyor interface controller when the robot controller is finished working with the pallet.

As each pallet approaches the component mounting station, a bar code reader 610 reads a bar code on the pallet which is used to identify the model of the board to be assembled. This information is conveyed to the robot controller. The robot controller contains stored information which associates the model information with the components that must be selected, tested, measured, trimmed, and mounted on the board. Based on this stored information, the robot controller sends location data and move data to the picker car controllers (model DCI 1000, DCI, Inc., Franklin, Mass.) over the RS 232 line and sends control bits over the discrete I/O line.

Each picker car includes a linear stepper motor for moving it along the rails and a picker car controller 612 which responds to the location data and move data received from the robot controller to move the picker car as required and to report back when the motion is completed. The picker car also responds directly to control bits by actuating vacuum valves which move the five suction tubes up and down and trigger and release the vacuum lines at the appropriate times to pick up and release the components or blanks.

The nests 614 also have vacuum lines and valves to control suction on the blanks or components as a means of holding them within the nests and to open and close the collet jaws. The dial nests also have pneumatic actuators to move the pogo pins up and down. The various vacuum lines, jaw solenoids, pogo pin actuators, and pneumatic actuators are all controlled directly by control bits sent over the discrete I/O link.

An end-of-arm tool 616 mounted on the end of the robot arm 174a (FIG. 6) has five suction tubes which operate similarly to the picker car tubes. An end-of-arm tool controller 618 responds to discrete I/O control bits to control vacuum valves and pneumatic actuators which provide control over component placement by controlling the raising and lowering of the suction tubes and rotation of the end-of-arm tool.

The measurement system 169 includes an IBM AT-compatible supervisory computer 630 which supervises two measurement instrument systems. The first measurement instrument system, which is connected to the dial nests for use in the laser trimming process, consists of a laser trimmer controller 632 (a Model No. HP9000, Series 310, computer, manufactured by Hewlett Packard, Palo Alto, Calif.) and a dial measurement instrument 634 manufactured by Electro-Scientific Industries, Portland, Oreg. The first measurement instrument system measures resistance only and is connected to the dial nests at location 166b (FIG. 6) in the manner illustrated in FIG. 11. The first measurement instrument system, which controls all aspects of the operation of the laser, including trimming, routine calibration and the reel-by-reel autocalibration process described above, is manufactured by Electro-Scientific Industries as part of the laser trimmer assembly 173 of FIG. 6. Bidirectional communication between the supervisory computer 630 and the laser trimmer controller 632 is via an RS-232 serial link. The second measurement instrument system consists of a programmable measurement instrument 636 and a programmable High-Voltage Power Supply 638. The programmable measurement instrument (a Keithley Instruments model 3322 LCZ meter in combination with Keithley model 705 scanners, manufactured by Keithley Instruments, Cleveland, Ohio, 44139, USA) is connected to, and capable of directly measuring, components which are placed in both the centering nests (156, FIG. 6) and the high voltage nest (779, FIG. 6). The programmable high-voltage power supply (Hewlett-Packard model 6035A, 0–500 V, 1 KWatt manufactured by Hewlett-Packard, Test and Measurement Division, Santa Clara, Calif., USA). All of the instruments in the second measurement instrument system include, and are connected to the supervisory computer 630 via, an IEEE-488 control bus interface.

The measurement system 169 receives measurement commands from the robot controller 602 via the RS-232 link between the robot controller and the supervisory computer 630. The supervisory computer passes information back to the robot controller via the same path. Information passed to the measurement system includes component and tolerance values, nest locations, information regarding whether a component is to be trimmed and commands which supervise the collection of autocalibration data associated with a new reel of blanks, as described above. Information passed back to the robot controller includes data indicating whether or not a component passed or failed test (if it fails, the robot controller initiates picking of another component) and data indicating success or failure in performing the laser autocalibration procedure associated with a new reel of blanks (if the autocalibration procedure fails, system control is returned to an operator). Information is passed by the supervisory computer 630 to one or the other of the measurement instrumentation systems depending upon whether the task involves laser trimming. Data regarding laser speed settings for each reel of resistor blanks is stored in the laser trimmer controller 632. The supervisory computer also stores measurement data acquired by the first measurement instrumentation system 636 if that data will subsequently be needed to calculate a trim value for the laser trimmer. Where trim values need to be calculated, the calculations are performed, and the relevant algorithms are stored, in the supervisory computer 630. As explained below, these values are communicated back to the robot controller by the supervisory computer as they become available.

Figure 18:
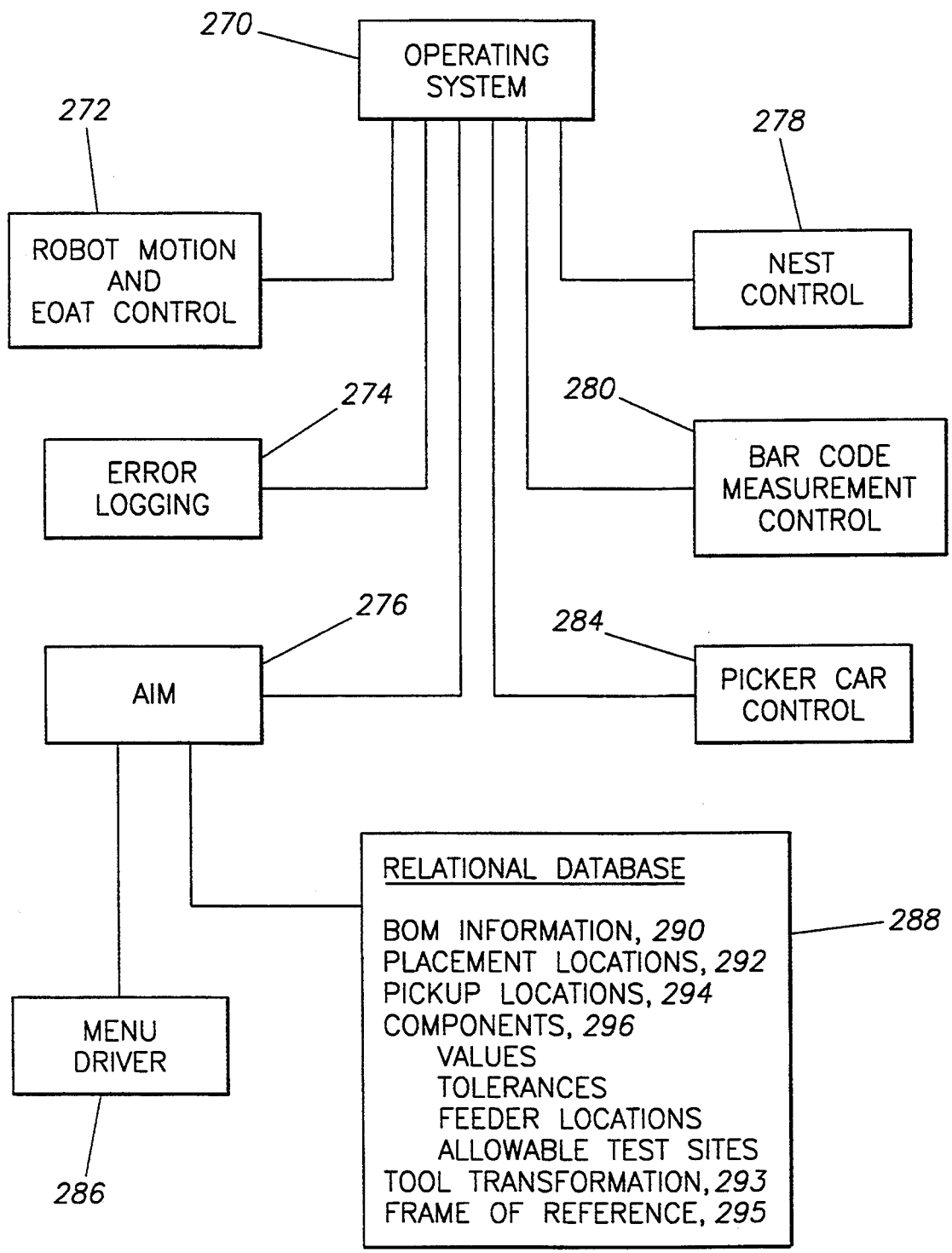
FIG. 18 is a block diagram of control software tasks.

Referring to FIG. 18, the software running in the robot controller includes a V+ language operating system 270 (Adept version 10.1). Tasks running under the operating system include a robot motion and EOAT control task 272, a nest control task 278, a picker car control task 284, and a bar code measurement controller interface 280, which respectively manage the interaction with the component mounting equipment in FIG. 17. The operating system is multi-tasking and the tasks run concurrently as needed to accomplish the jobs assigned to each of them. The operating system 270 also runs an error logging task 274 which stores error occurrence information pointing to possible production line problems. Also running under the operating system is a management information system 276 which includes a relational database management shell called Assembly Information Management System (AIM 2.0L, Adept Technology). A menu driver 286 allows interaction with system operators.

The relational database 288 holds BOM information 290 indicating the components to be placed, their associated reference designations, and whether or not the component is to be trimmed. The reference designations correspond to placement locations on a PCB. Placement and pickup locations 292, 294 indicate: (1) actual coordinate locations on the PCB corresponding to the reference designations and (2) nest pickup coordinates, respectively. Component data 296 includes component and tolerance values, feeder locations from which the component is to be picked, and allowable test sites (e.g. nests into which the component may be placed for testing). Allowable test site information is needed because: (1) as explained above, parts which are to be trimmed must be placed in nests other than those used for fixed parts; and (2) different nests may be required to accommodate parts of different physical sizes. Tool transformation 293 and frame of reference 295 information allow the robot controller to correctly control the spatial location of the end-of-arm-tool (EOAT) to result in accurate placement of components onto the PCB. For example, each suction tube on the EOAT is in a different spatial position relative to the vertical centerline of the EOAT. To accurately position a component at a fixed spatial location on the PCB, the robot controller must position the centerline and angular position of the EOAT so as to compensate for the spatial offset from centerline of the suction tube which is holding the component.

The robot controller controls the picking of components and blanks from feeders and placement of the components and blanks into nests. This applies to both fixed components (e.g. components which have been set by the manufacturer to a prespecified value and tolerance) and trimmed components (e.g. resistor blanks which are trimmed to a final value by the laser trimming system). Thus, when a pallet enters the component mounting station, and the robot controller has determined the type of circuit to be built, it accesses the BOM for the circuit assembly, and related information (e.g. component data) and begins to pick components and place them in nests. The general strategy for picking parts is to determine how many test sites (e.g. nests of different types) are available and select as many parts from the BOM as are available to fill the available test sites. Thus, if four nests are available for testing fixed parts and five trim nests are available, the robot controller will take the first four suitable (e.g., which are compatible with the nest) fixed parts that it finds in the BOM and the first five suitable trimmable parts that it finds in the BOM. Thus, the BOM may be viewed as a queue from which the robot controller selects components so as to optimize use of available nest capacity. As components are picked, trimmed (if necessary), and measured the supervisory computer stores information regarding actual measured values and calculates values of relevant trimmed components in accordance with stored algorithms. It sends these calculated values back to the robot controller as they become available, along with information regarding the blank to be used for trimming (which the supervisory computer determines by means of a stored look-up table of the kind shown in FIG. 21), and these are added to the robot controller's list of parts to be picked. Thus, for each and every component, the robot controller sends specific information to the supervisory computer regarding nest location of a component or blank, the desired value and tolerance of the component or trimmed blank, and information telling the supervisory computer whether trimming is required (e.g. via a "trim flag" bit sent by the robot controller to the supervisory computer). When the trim flag is set (indicating that a trim is required) the supervisory computer passes control to the first measurement instrumentation system; when the flag is reset (indicating that trimming is not required) the supervisory computer passes control to the second measurement instrumentation system. Interaction between the robot controller and the measurement system, for three classes of components, may be summarized as follows:

(1) Fixed components: the robot controller sends the part to a centering nest (e.g. 156, FIG. 6) and sends the nest location, part value and tolerance, and a trim flag indicating that the part is not to be trimmed, to the supervisory computer. In turn, supervisory computer 630 signals the second measurement instrument system 636 to perform the measurement, and receives back data representing the measured value. When the measured value is returned to the supervisory computer it compares the value to the expected value and tolerance information and reports back to the robot controller that the test was either passed or failed. If failed, the component is discarded and the robot controller initiates another pick cycle.

(2) Trimmed Components Having a Predetermined Value: These are resistors which have a predetermined, fixed, value and tolerance but which are made on-line by trimming appropriate blanks (e.g. resistor R1 in the BOMs of FIG. 5a). For these parts the robot controller selects an appropriate blank and sends it to a nest on the indexing dial (e.g. 163, FIG. 6). The nest location, part value and tolerance, and a trim flag indicating that the part is to be trimmed, are sent by the robot controller to the supervisory computer. In turn, the supervisory computer 630 signals the first measurement instrument system 632 to perform the trim and measurement, and receives back data representing the measured value. When the measured value is returned to the supervisory computer it is compared to the desired value and tolerance information and the supervisory computer reports back to the robot controller that the test was either passed or failed. If failed, the component is discarded and the robot controller initiates another pick cycle.

(3) Trimmed Components having a Calculated Value: These are resistors having values which are calculated by the supervisory computer based upon actual measured values of other components and which are made on-line by trimming appropriate blanks (e.g. resistor R2 in the BOMs of FIG. 5a). For these parts, the robot controller receives the calculated value from the supervisory computer, along with information regarding which blank to use. At some point in time after receiving the information (e.g. when, as described above, the part is accessed by the robot controller from the queue of parts). It picks the appropriate blank and sends it to an appropriate nest on the indexing dial (e.g. 163, FIG. 6). The nest location, part value and tolerance, and a trim flag indicating that the part is to be trimmed, are sent by the robot controller to the supervisory computer. In turn, the supervisory computer 630 signals the first measurement instrument system 632 to perform the trim and measurement, and receives back data representing the measured value. When the measured value is returned to the supervisory computer it is compared to the expected value and tolerance information and the supervisory computer reports back to the robot controller that the test was either passed or failed. If failed, the component is discarded and the robot controller initiates another pick cycle.

Figure 19A:
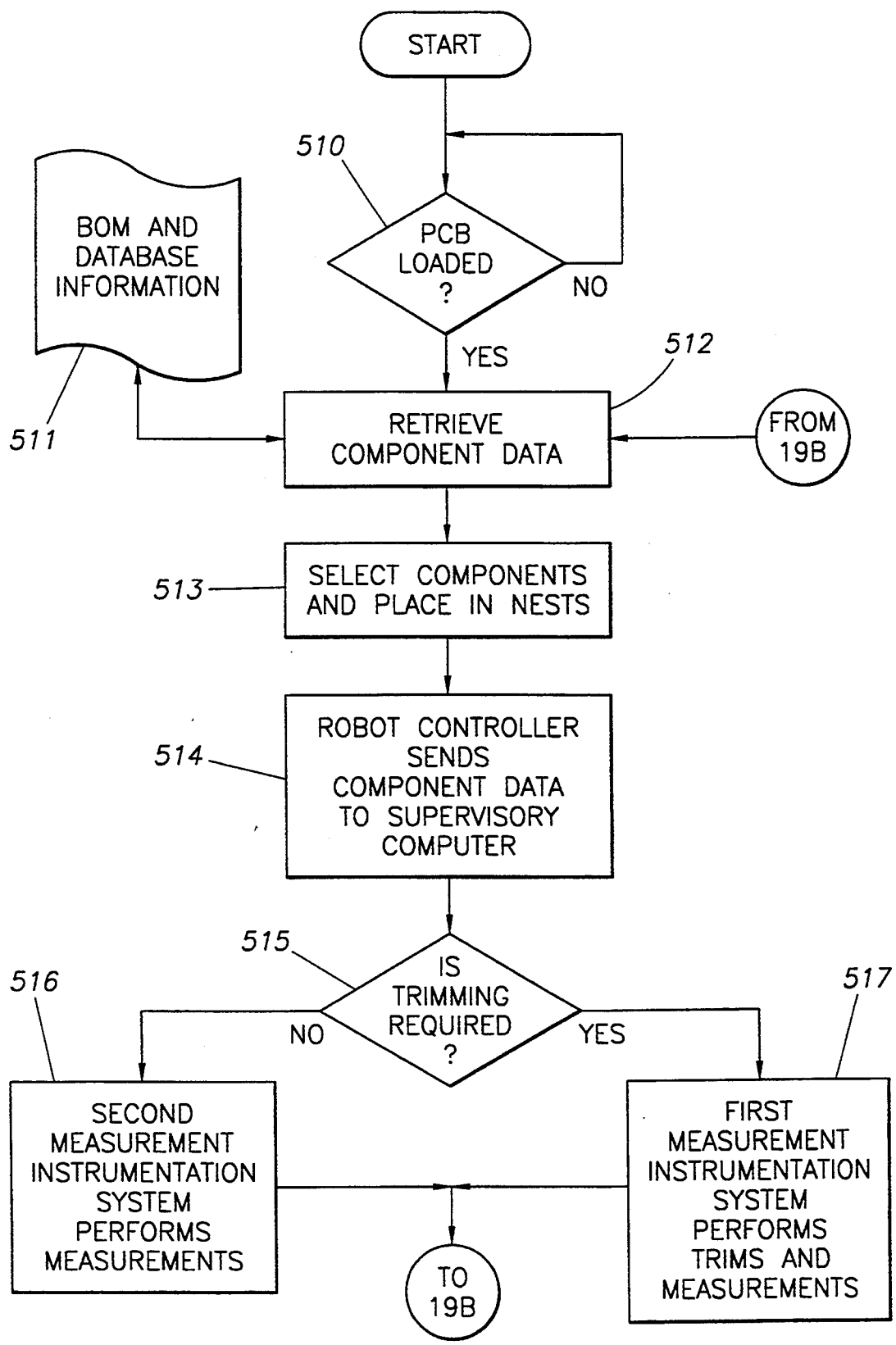
FIG. 19 is a flow chart of a control sequence.
Figure 19B:
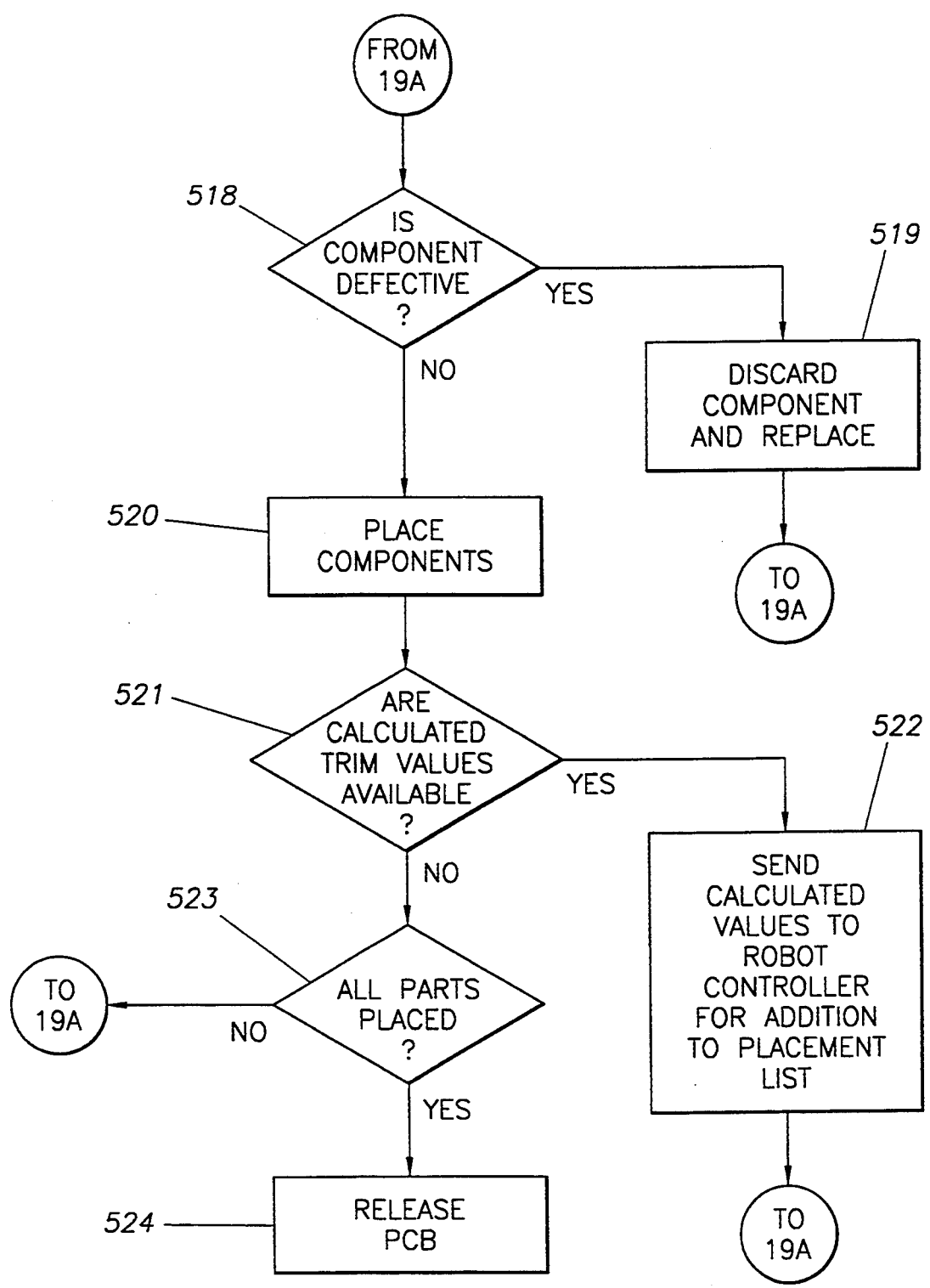

Referring to FIG. 19, in a typical sequence of control, the system remains in a wait state (510) until a pallet carrying a PCB reaches the component mounting station, as indicated by the conveyor sensor. By use of the bar code reader the model of the circuit to be assembled, and the corresponding BOM and related database information (e.g. including, for example, component information, and feeder and nest locations as described above in regards to FIGS. 17 and 18) 511, are identified. The robot controller identifies available test nests and retrieves values, tolerances and feeder location for one or more components or blanks which are compatible with the available nests (512). The components or blanks are picked and placed in the nests (513). The robot controller sends to the supervisory computer component data relating to the components to be tested (or trimmed and tested) (514) (i.e. value, tolerance, nest location and a trim flag indicating whether trimming is required). If the trim flag indicates that trimming is required (515), data regarding dial nest locations and trim values are routed to the first measurement information system; for fixed components data regarding nest locations and type of component to be tested is routed to the second measurement information system. Fixed components are measured (516); trimmed components are trimmed and measured (517). If a component is determined to be defective (518), it is discarded and information regarding the component is sent back to the robot controller (519) so that the component may be repicked, retrimmed (if necessary) and retested; else the parts are placed onto the PCB (520). If calculated values of trimmable resistors are available (521), then these calculated values, along with information regarding blanks to be used to make the resistors, are sent to the robot controller by the supervisory computer (522). The robot controller will add the information to its queue of parts for subsequent picking and trimming (i.e. via steps 512–518). After all components have been mounted (523), the pallet carrying the PCB is released (524) and advances on the production line for further processing. Otherwise, if more components are needed, another set of component data is retrieved from the database and the control sequence is repeated.

Figure 20A:
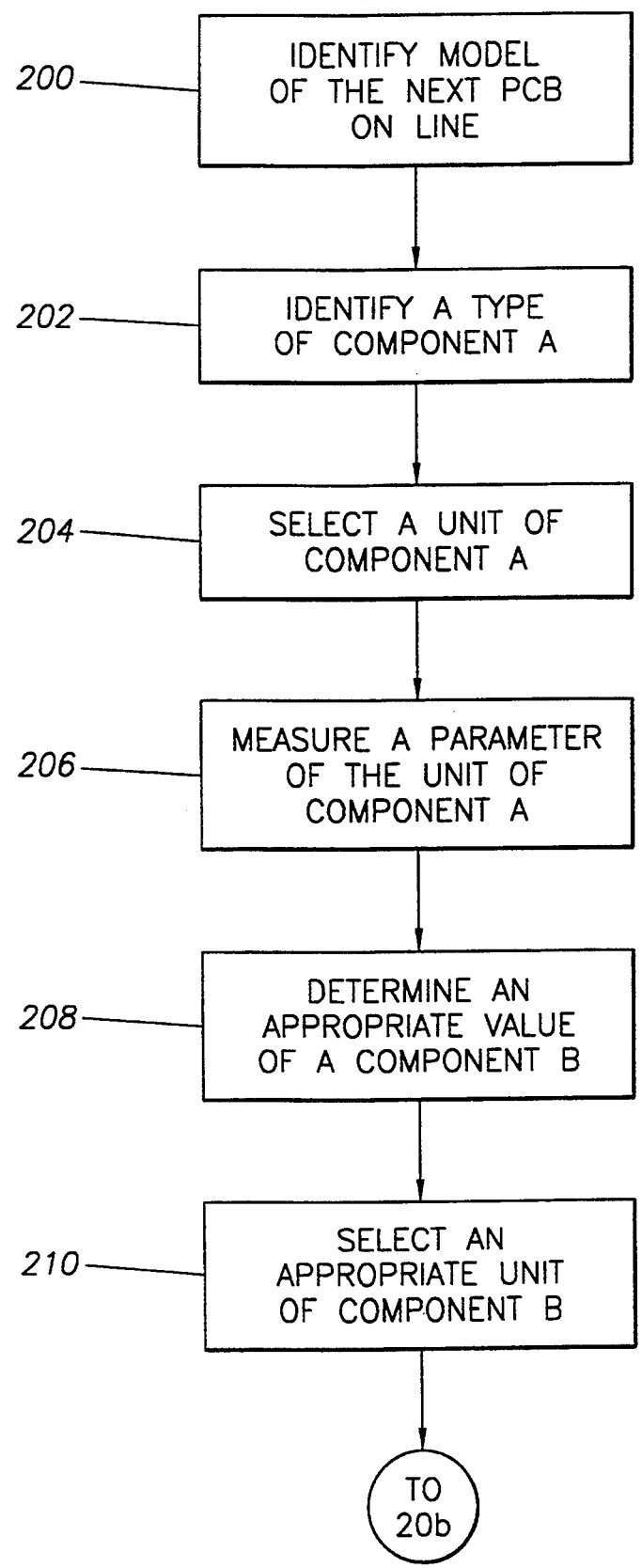
FIG. 20 is a flow chart of a control sequence.
Figure 20B:
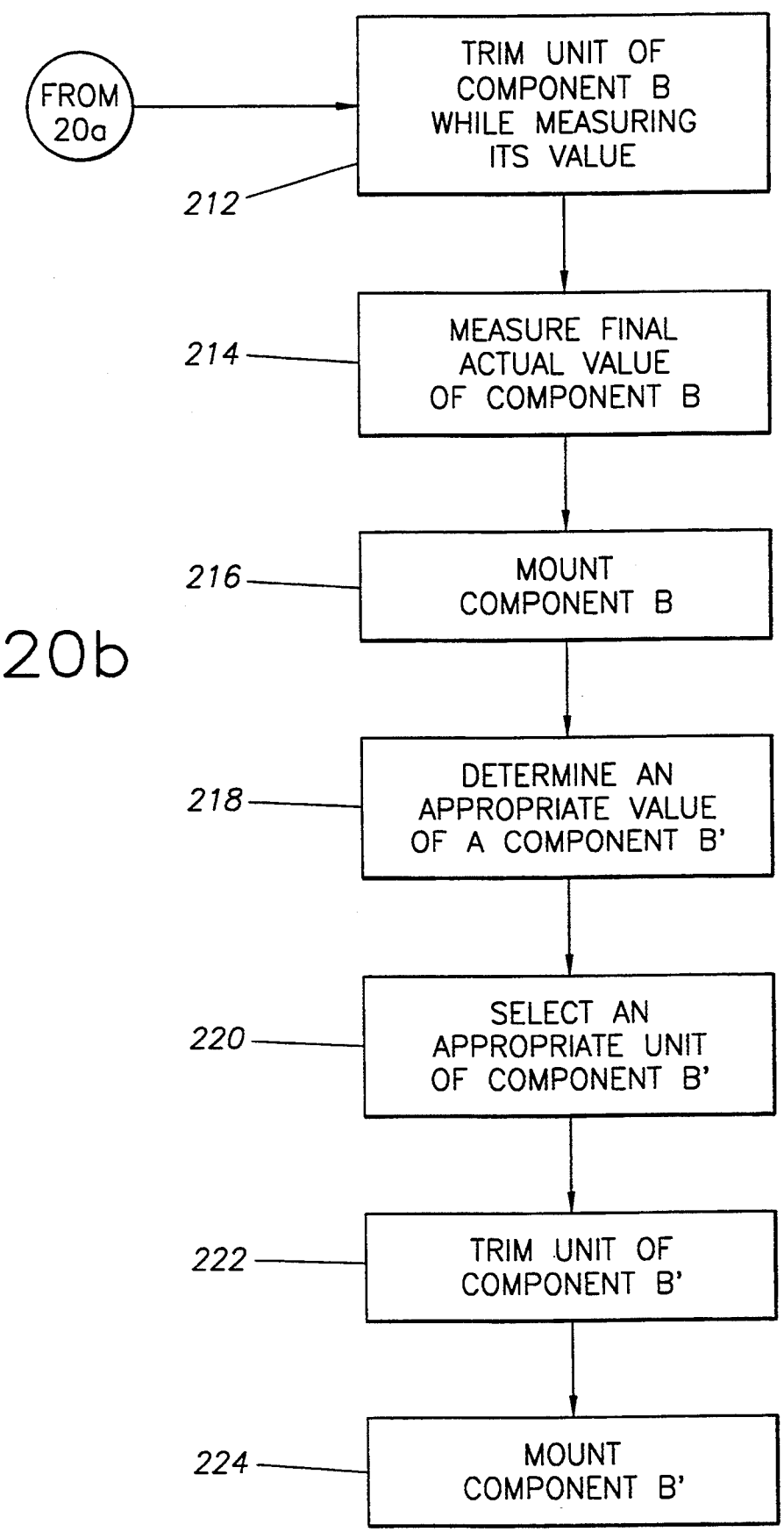

Thus, referring to FIG. 20, at least in some situations it is now clear that after identifying the model of the next PCB on the line (200) the system might first identify (202) a type of component A which would be one of given fixed characteristics, i.e., not trimmable. By "model" of PCB could be meant, for example, the input and output characteristics (as in the BOMs discussed above); or more fundamental functional and architectural differences (e.g., different power conversion topologies, or circuits which do not perform power conversion at all). By "type" of component we mean one of several different categories of integrated circuits, for example, or different models of a given type of component.

The system would then select (204), from an available supply, a unit of the appropriate type of component A. A parameter of the unit of component A is measured (206). Using the list of predetermined values associated with the particular circuit, an appropriate value of a component B (e.g., a trimmable resistor) for use in the circuit is then determined (208) based on the measured value of component A. Next an appropriate unit of component B is selected from available supplies. If component B is a trimmable resistor, a number (say 40) of different resistor blanks might be available in separate supplies. Each type of blank could be usable for a different range of resistance. Selecting (210) an appropriate unit then means picking a blank from the appropriate supply. The selected unit would then be trimmed (212) while measuring its value. Once the trimming is finished the final actual value of the component is measured (214). Then the component is mounted (216) on the circuit. In some examples, the next step is to determine (218) an appropriate value of yet another component (e.g., a second trimmable resistor). Then an appropriate unit of component B' is selected (220), trimmed (222) and mounted (224).

One important benefit of the invention is that the overall inventory of types of resistors (i.e., the number of feeders 157a in FIG. 6) on an assembly line may be reduced relative to the number of parts which might otherwise be required if fixed resistors were kept on line. Each value of fixed resistor would otherwise require its own feeder. Although, the resistance values of these trimmable resistors may be standard and available from resistor manufacturers without the need for additional trimming, allowing the component to be trimmed during the assembly of the circuit reduces resistor value inventory and the number of corresponding feeders required to fabricate a circuit. For example, FIG. 21 shows a list of forty ¼ Watt resistor blanks having nominal values between 6.8 Ohms and 6.8 Megohms. These blanks can be used to produce trimmed values in the range of 8 Ohms to 12 Megohms. Thus, relatively few (N) blanks can be used to produce an essentially limitless number (M) of trimmed resistance values, and use of the invention eliminates the need to keep large numbers of feeders on line to store quantities of different values of resistors.

Other embodiments are within the scope of the claims that follow Appendix A. For example, the trimmable component need not be a resistor but could be a hybrid resistor network, or a resistive element screened onto the surface of a PCB. Instead of measuring a single component A for purposes of determining the appropriate value of a trimmable component B, the measurement could be of a portion of an unfinished circuit including multiple interconnected components.

Appendix A

In FIG. 4, an exemplary forward converter 10 (see, e.g., Vinciarelli U.S. Pat. No. 4,415,959, incorporated by reference) includes an input RFI filter 12 which exhibits a low impedance (via capacitor 16) to the flow of switch current (Isw) at high frequencies (e.g., 1 MHz) while attenuating the amount of high-frequency signal which flows back toward the input source. The converter includes a FET (field-effect transistor) main switch 20 and a leakage inductance transformer 22 having a primary winding 23 and a secondary winding 25 which allow provide a controlled amount of reflected secondary leakage L12. The converter also includes a first unidirectional conducting device 24, a first capacitor 26, a second unidirectional conducting device 28, and an output filter 30 comprising output inductor 32 and output capacitor 34. A circuit 36 (e.g., as described in U.S. Pat. No. 4,441,146 to Vinciarelli, incorporated by reference) performs optimal resetting of the transformer core. Circuit 36 also includes a reset capacitor 38, a reset unidirectional conducting device 40, an a FET switch 42, and a reset winding 44 on transformer 22. Two resistors 46, 48 form a voltage divider, the output of which is fed to an error amplifier 50. The error amplifier includes isolated amplifier 52 and voltage reference (Vref1) 54. The isolated amplifier accepts two inputs referenced to the secondary return and delivers a control current, Icont, referenced to the primary return. Isolation is achieved by magnetic coupling within the isolated amplifier.

The current-to-frequency converter 60 delivers a pulse train at a frequency indicated by Icont. An increase (decrease) in Icont causes the frequency of the pulse train to increase (decrease). The pulse train is fed to zero-current switching (ZCS) controller 70 which, by means of main switch signal 71, turns the main switch 20 on when a pulse is received from the current-to-frequency converter 60 and turns the main switch off when the switch current Isw returns essentially to zero (as indicated by the signal Isense received by the ZCS controller from the current transformer 75). The reset switch 42 is turned off when the main switch is turned on and is turned on when the main switch is turned off (via reset switch signal 72). The system regulates the output voltage as described in connection with the circuit of FIG. 1. That is, the output of the error amplifier will force the current-to-frequency converter to drive the ZCS converter at a frequency which maintains the average voltage at the two inputs to the error amplifier essentially equal. If Vout is low, the error amplifier output will cause the frequency to increase, and vice versa.

Figure 22:
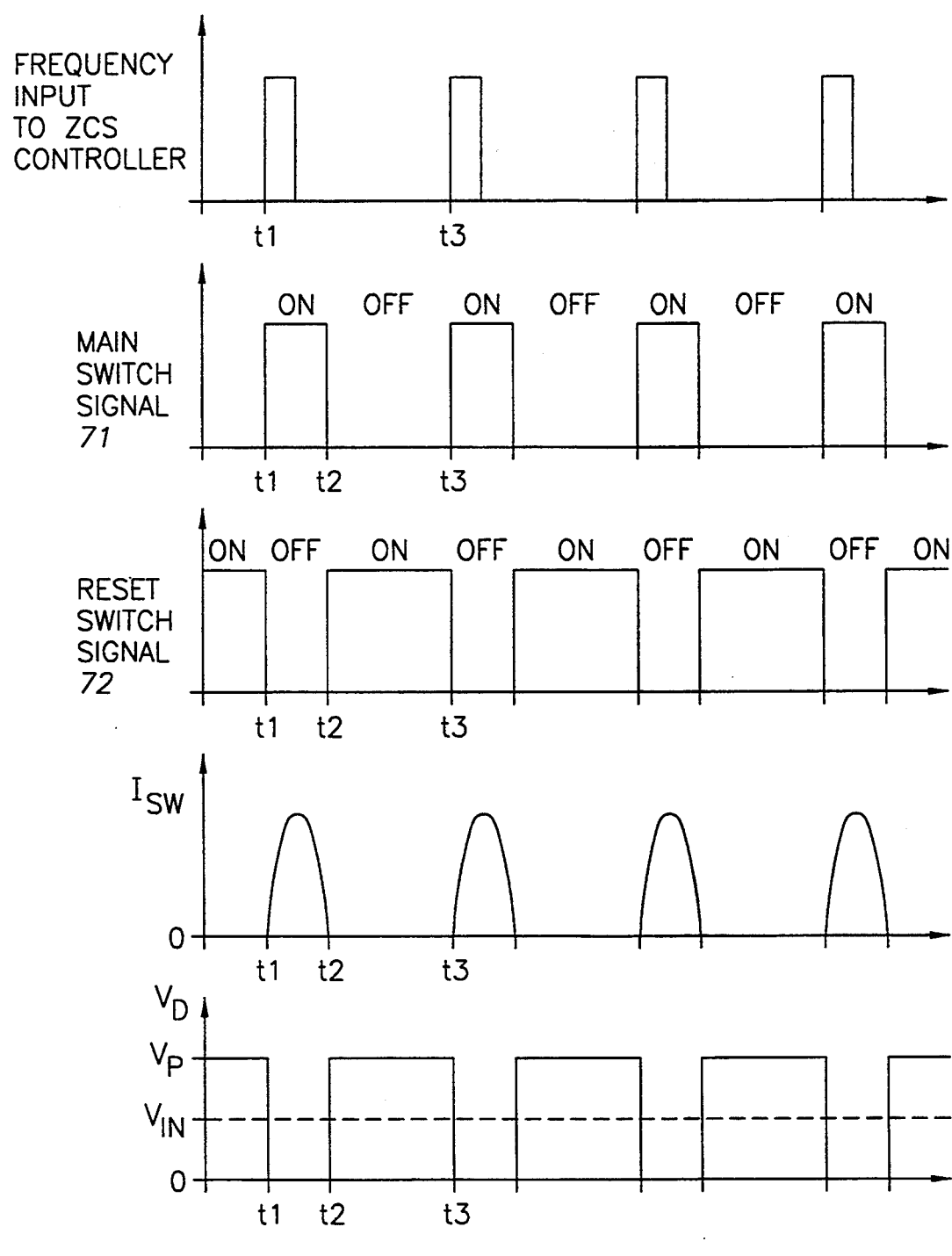
FIG. 22 is a timing diagram for the converter of FIG. 4.

In operation, FIG. 22, as the main and reset switches turn on and off, the voltage Vd at the drain of the main switch swings essentially between zero volts (when the main switch is on) and a value Vp (when the main switch is off). As explained in Vinciarelli U.S. Pat. No. 4,441,146, the value of Vp can be approximated by $Vp=Vin(1+D)$, where D is the ratio of the on time of the main switch (t2-t1 in FIG. 22) to the off time (t3-t2 in FIG. 4). Vp is greater than Vin.

During the off-time of the main switch the voltage across the reset capacitor is reflected into the primary winding. As a result, Vp is the sum of the primary-reflected reset capacitor voltage and the value of the input source, Vin. During steady-state operation, the voltage across an appropriately sized reset capacitor will be essentially constant during the main switch off-time. However, the voltage across the reset capacitor cannot change instantaneously, so sudden changes in input voltage or loading may cause sudden changes in Vp.

As a result, the voltage across the main switch may, under transient conditions, suddenly rise above the rated voltage of the switch. For instance, running the converter fully loaded at minimum input voltage results in a relatively high operating frequency and a high duty cycle. If, for example, the converter is running with Vin=200 VDC and D=1 (ton=toff), then Vp=400 V and the voltage reflected into the primary winding during the off time of the switch is 200 V. Then, if a transient voltage occurs which causes Vin to momentarily rise to 410 V, because the reset capacitor voltage cannot change instantaneously, the voltage across the main switch on the next duty cycle will rise to 410+200=610 V. If a 600 V rated FET is used, this could cause a failure. To avoid this, a primary overvoltage protection circuit (OVP circuit) is provided which inhibits turn-on of the main switch when excessive FET drain voltage is sensed (if the main and reset switches are not turned on and off, the voltage at the drain of the main FET will return to a value Vin).

The OVP circuit operates as follows. The main switch drain voltage Vd is delivered to a voltage divider (resistors R3 and R4) and a capacitor C3 via a diode 81. The capacitor C3 and the diode form a peak detector which charges to the instantaneous peak value of Vd. The discharge time is determined by the time constant of the voltage divider and capacitor C3. The output of the divider is fed to one input of a comparator 88, the other input of which is connected to a reference voltage Vref2. If the peak value of Vd rises above a value Vdmax=Vref2(1+R3/R4), the output of comparator 88 goes low and the current Icont is shunted to ground. Diode 89 is provided on the output of comparator 88 to prevent interaction between the comparator output and the output of the isolated amplifier 52 when the peak value of Vd is below Vdmax and the comparator output is high. By shunting Icont to ground, the input to the current-to-frequency converter is removed and further switching is prevented. After Vd drops back below Vdmax, capacitor 82 will discharge and the output of comparator 88 will return to its high state.

The values of R3 and R4 are a function of Vdmax and Vref2. Vdmax is prespecified to be somewhat below the peak withstand voltage rating of the main switch FET (e.g. for a FET rated at 600 V, as in the example above, Vdmax might be set at 550 V). It is also usually desirable to select R3 and R4 such that the Thevenin's impedance, Rt, presented by R3 and R4 at the comparator input (where Rt is approximately equal to the values of R3 and R4 in parallel) is at some relatively fixed, relatively low, value (e.g. 10,000 ohms). This allows for nullifying the effects of input offset current in the comparator and improves noise immunity. With these conditions a nominal value of R3 may be determined:

$$R3 = Rt*(Vdmax/Vref2).$$

To determine the correct value for R4 a resistor of nominal value R3 could be selected (either a fixed resistor or a resistor made by trimming a blank) and the actual value of R3, R3act, measured. The actual value of Vref2, Vref2act, would also be determined by measuring the source of the voltage (e.g. by measuring the actual integrated circuit which will be used in the particular circuit assembly to provide Vref2). Knowing the actual values of the components which will be used for R3 and Vref2 allows calculating the required value for R4, R4act:

$$R4act = R3act.Vref2act/(Vdmax - Vref2act).$$

C3 may be selected so that its value, in combination with the values of R3 and R4, results in a desired value of T. In general, this value is not extremely critical, so C3 may be prespecified based upon foreknowledge of nominal values of circuit elements (e.g. R3, R4) for different models of converters.

What is claimed is:

1. A method for providing an electronic component for connection in a corresponding one of a plurality of electronic circuits being manufactured on a production line, comprising
    providing a supply of component blanks,
    making a measurement of at least one of the following:
        a parameter of another component to be included in the corresponding one
        of the electronic circuits, and
        a parameter of a portion of the corresponding one of the electronic circuits,
    determining from the measured parameter an an appropriate value for the electronic component,
    forming said electronic component by removing material from one of said blanks to cause the blank to have the appropriate value, and
    delivering said electronic component for connection in the corresponding one of said electronic circuits.

2. The method of claim 1 further comprising
    providing N different supplies of blanks, and
    forming greater than N different electronic components from said blanks, N being a number greater than zero.

3. The method of claim 2 wherein said step of providing comprises providing N different supplies of resistor blanks, each supply being suitable for forming resistors having resistances within a particular range, and said step of forming comprises laser trimming said resistor blanks.

4. The method of claim 3 wherein all of the resistors required for said electronic circuits are formed by said laser trimming.

5. The method of claim 4 wherein some of said resistors have values which do not differ among said electronic circuits.

6. The method of claim 1 wherein said step of providing comprises providing a supply of resistor blanks and said step of forming comprises laser trimming one of said resistor blanks.

7. The method of claim 1, wherein the measured parameter comprises a value of resistance.

8. The method of claim 1, wherein the measured parameter comprises a voltage level.

9. The method of claim 1, wherein the measured parameter comprises a value of capacitance.

10. Apparatus for providing an electronic component for connection in a corresponding one of a plurality of electronic circuits being manufactured on a production line, comprising
    a supply of component blanks,
    means for making a measurement of at least one of the following:
        a parameter of another component to be included in the corresponding one of the electronic circuits, and
        a parameter of a portion of the corresponding one of the electronic circuits,
    means for determining from the measured parameter an appropriate value for the electronic component, means for forming said electronic component by removing material from one of said blanks to cause the blank to have the appropriate value, and means for delivering said electronic component for connection in the corresponding one of said electronic circuits.

11. The apparatus of claim 10 further comprising N different supplies of component blanks wherein N is a number greater than zero.

12. The apparatus of claim 10 further comprising a robot for mounting said electronic on said corresponding electronic circuit.

13. The apparatus of claim 10 wherein said means for forming comprises a laser.

14. The apparatus of claim 10, wherein the measured parameter comprises a value of resistance.

15. The apparatus of claim 10, wherein the measured parameter comprises a voltage level.

16. The apparatus of claim 10, wherein the measured parameter comprises a value of capacitance.

17. A method for high-rolaids, high-mix manufacture of electronic circuits on a production line, wherein the mix requires a number M of different component values within a range of values R, M being a number greater than one, comprising providing N different supplies of component blanks, N being a number greater than zero and less than M, each supply suitable for making trimmed components having values within a subrange S of range R, making a measurement of at least one of the following:
 a parameter of a component to be included in each of the circuits, and
 a parameter of a portion of each of the circuits, determining from the measured parameter an appropriate value in the subrange S for each of the trimmed components, forming each of said trimmed components by selecting a component blank from one of said supplies and trimming said component blank to the appropriate value, and delivering each of said trimmed components for connection in a corresponding one of said electronic circuits.

18. The method of claim 17 wherein said step of providing comprises providing N different supplies of resistor blanks and said step of forming comprises laser trimming one of said resistor blanks.

19. Apparatus for high-volume, high-mix manufacture of electronic circuits on a production line, wherein the mix requires a number M of different component values within a range of values R, M being a number greater than one, comprising means for providing N different supplies of component blanks, N being a number greater than zero and less than M, each supply suitable for making trimmed components having values within a subrange S of range R, means for making a measurement of at least one of the following:
 a parameter of a component to be included in each of the circuits, and
 a parameter of a portion of each of the circuits, means for determining from the measured parameter an appropriate value in the subrange s for each of the trimmed components, means for forming each of said trimmed components by selecting a component blank from one of said supplies and trimming said component blank to the appropriate value, and means for delivering each of said trimmed components for connection in a corresponding one of said electronic circuits.

20. A method of manufacturing electronic circuits on a production line, each circuit including an alterable component having a parameter value which can be altered, said method comprising providing a supply of the alterable components, and for each electronic circuit on the production line,
 making a measurement of at least one of the following:
  a parameter of another component to be included in the circuit, and
  a parameter of a portion of the circuit, determining from the measured parameter an appropriate value for the alterable component,
 selecting an alterable component from the supply,
 removing material from the alterable component to cause it to have the appropriate value, and
 connecting the alterable component from which the material has been removed into the circuit.

21. The method of claim 20 further comprising after removing material from the alterable component,
 measuring the actual value of the alterable component, and
 determining an appropriate value for another component to be connected in the circuit based on the actual value of the alterable component.

22. The method of claim 20 wherein the removing is done by laser trimming.

23. The method of claim 20 wherein the alterable component comprises a resistor.

24. The method of claim 20 wherein said electronic circuits comprise power converters.

25. The method of claim 20 wherein the electronic circuits being fabricated on the production line include identical circuits.

26. The method of claim 20 wherein the electronic circuits being fabricated on the production line include different circuits.

27. A method of manufacturing power converters moving along an automated production line, each converter including a trimmable resistor, said method comprising providing a supply of the trimmable resistors at a station along the production line, and for each converter that approaches the station on the production line:
making a measurement of a parameter of another component to be included in the converter,
determining from the measured parameter an appropriate resistance for the trimmable resistor,
selecting a trimmable resistor from the supply,
laser trimming the trimable resistor to the appropriate resistance, and
connecting the trimmed resistor into the converter.

* * * * *

UNITED STATES PATENT AND TRADEMARK OFFICE
CERTIFICATE OF CORRECTION

PATENT NO. : 5,443,534
DATED : August 22, 1995
INVENTOR(S) : Patrizio Vinciarelli; Hubert R. Zeller, III It is certified that error appears in the above-indentified patent and that said Letters Patent is hereby corrected as shown below:

On the title page, item [54] and column 1, change "PROVIDING ELECTRONIC COMPONENTS FOR CIRCUITY ASSEMBLY" to --PROVIDING ELECTRONIC COMPONENTS FOR CIRCUIT ASSEMBLY--.

Col. 20, line 5, delete "allow".

Col. 20, line 14, after "an" delete the word "a".

Col. 22, claim 1, line 20, delete second occurrence of "an".

Col. 23, claim 12, line 11, after "mounting" change "said electronic" to --said electronic component--.

Col. 23, claim 17, line 21, change "high-rolaids" to --high-volume--.

Signed and Sealed this

Twenty-sixth Day of October, 1999

Attest:

Q. TODD DICKINSON

*Attesting Officer*         *Acting Commissioner of Patents and Trademarks*